(12) United States Patent
Pelham

(10) Patent No.: US 7,797,655 B1
(45) Date of Patent: *Sep. 14, 2010

(54) USING STANDARD PATTERN TILES AND CUSTOM PATTERN TILES TO GENERATE A SEMICONDUCTOR DESIGN LAYOUT HAVING A DEEP WELL STRUCTURE FOR ROUTING BODY-BIAS VOLTAGE

(76) Inventor: Michael Pelham, 1355 Sage Hen Way #G, Sunnyvale, CA (US) 94087

( * ) Notice: Subject to any disclaimer, the term of this patent is extended or adjusted under 35 U.S.C. 154(b) by 315 days.

This patent is subject to a terminal disclaimer.

(21) Appl. No.: 11/999,279

(22) Filed: Dec. 4, 2007

Related U.S. Application Data

(63) Continuation of application No. 11/193,723, filed on Jul. 28, 2005, now Pat. No. 7,305,647.

(51) Int. Cl.
*G06F 17/50* (2006.01)
(52) U.S. Cl. .................................. 716/5; 716/9; 716/10
(58) Field of Classification Search ....................... 716/5, 716/9, 10
See application file for complete search history.

(56) References Cited

U.S. PATENT DOCUMENTS

| | | | |
|---|---|---|---|
| 4,605,980 A | 8/1986 | Hartranft et al. |
| 4,907,058 A | 3/1990 | Sakai |
| 5,160,816 A | 11/1992 | Chlop |
| 5,355,008 A | 10/1994 | Moyer et al. |
| 5,447,876 A | 9/1995 | Moyer et al. |
| 5,552,333 A | 9/1996 | Cheung et al. |
| 5,636,129 A | 6/1997 | Her |
| 5,726,477 A | 3/1998 | Williams et al. |
| 5,781,034 A | 7/1998 | Rees et al. |
| 5,895,940 A | 4/1999 | Kim |
| 5,913,122 A | 6/1999 | Lee et al. |
| 6,048,746 A | 4/2000 | Burr |
| 6,087,892 A | 7/2000 | Burr |
| 6,091,283 A | 7/2000 | Murgula et al. |
| 6,169,310 B1 | 1/2001 | Kalnitsky et al. |
| 6,180,998 B1 | 1/2001 | Crafts |
| 6,194,776 B1 | 2/2001 | Amano et al. |
| 6,218,708 B1 | 4/2001 | Burr |
| 6,218,895 B1 | 4/2001 | De et al. |
| 6,260,179 B1 | 7/2001 | Ohsawa et al. |
| 6,303,444 B1 | 10/2001 | Burr |
| 6,405,358 B1 | 6/2002 | Nuber |
| 6,412,102 B1 | 6/2002 | Andreev et al. |
| 6,489,224 B1 | 12/2002 | Burr |
| 6,498,592 B1 | 12/2002 | Matthies |
| 6,536,028 B1 | 3/2003 | Katsioulas et al. |
| 6,570,810 B2 | 5/2003 | Wong |
| 6,617,656 B2 | 9/2003 | Lee et al. |
| 6,677,643 B2 | 1/2004 | Iwamoto et al. |

(Continued)

FOREIGN PATENT DOCUMENTS

EP        0624909 A2        11/1994

(Continued)

*Primary Examiner*—Phallaka Kik

(57) ABSTRACT

A semiconductor design layout having a deep well structure for routing body-bias voltage is generated using standard pattern tiles and custom pattern tiles. These tiles have a tile shape and a tile size that fit an integer number of times into a grid unit of a grid for the semiconductor design layout.

20 Claims, 28 Drawing Sheets

U.S. PATENT DOCUMENTS

| | | | |
|---|---|---|---|
| 6,724,044 | B2 | 4/2004 | Blanchard |
| 6,772,859 | B2 | 8/2004 | D'Antonio et al. |
| 6,777,978 | B2 | 8/2004 | Hart et al. |
| 6,813,756 | B2 | 11/2004 | Igarashi et al. |
| 6,892,375 | B2 | 5/2005 | Kimura |
| 6,936,898 | B2 | 8/2005 | Pelham et al. |
| 7,003,748 | B1 | 2/2006 | Hsu |
| 7,049,699 | B1 | 5/2006 | Masleid et al. |
| 7,098,512 | B1 | 8/2006 | Pelham et al. |
| 7,211,478 | B1 | 5/2007 | Pelham et al. |
| 7,305,647 | B1 * | 12/2007 | Pelham ................ 716/13 |
| 7,370,307 | B2 * | 5/2008 | Seta .................... 716/12 |
| 7,376,931 | B2 * | 5/2008 | Kokubun .............. 716/21 |
| 7,388,260 | B1 | 6/2008 | Masleid et al. |
| 7,467,077 | B2 * | 12/2008 | Hirai ................... 703/14 |
| 2001/0024859 | A1 | 9/2001 | Takahashi et al. |
| 2001/0028577 | A1 | 10/2001 | Sung et al. |
| 2002/0040985 | A1 | 4/2002 | Aldrich |
| 2003/0121017 | A1 | 6/2003 | Andreev et al. |
| 2003/0237064 | A1 | 12/2003 | White et al. |
| 2004/0019870 | A1 | 1/2004 | Ohmori |
| 2004/0085099 | A1 | 5/2004 | Ratchkov et al. |
| 2004/0124475 | A1 | 7/2004 | Pelham et al. |
| 2004/0128631 | A1 | 7/2004 | Ditzel et al. |
| 2004/0128636 | A1 | 7/2004 | Ishikura |
| 2004/0178493 | A1 | 9/2004 | Correale, Jr. |
| 2004/0216074 | A1 | 10/2004 | Hart et al. |
| 2005/0127428 | A1 | 6/2005 | Mokhlesi et al. |
| 2006/0026551 | A1 | 2/2006 | Shrowty et al. |
| 2006/0102958 | A1 | 5/2006 | Masleid |
| 2006/0277520 | A1 | 12/2006 | Gennari |
| 2006/0282798 | A1 | 12/2006 | Beattie et al. |
| 2007/0038430 | A1 | 2/2007 | Walker et al. |
| 2007/0300191 | A1 * | 12/2007 | Beattie et al. ............. 716/1 |
| 2009/0031261 | A1 * | 1/2009 | Smith et al. ............. 716/2 |

FOREIGN PATENT DOCUMENTS

| | | |
|---|---|---|
| JP | 10199993 | 7/1998 |

* cited by examiner

900A

900B

1100A

STANDARD PATTERN TILE

U = K*N

N is an integer

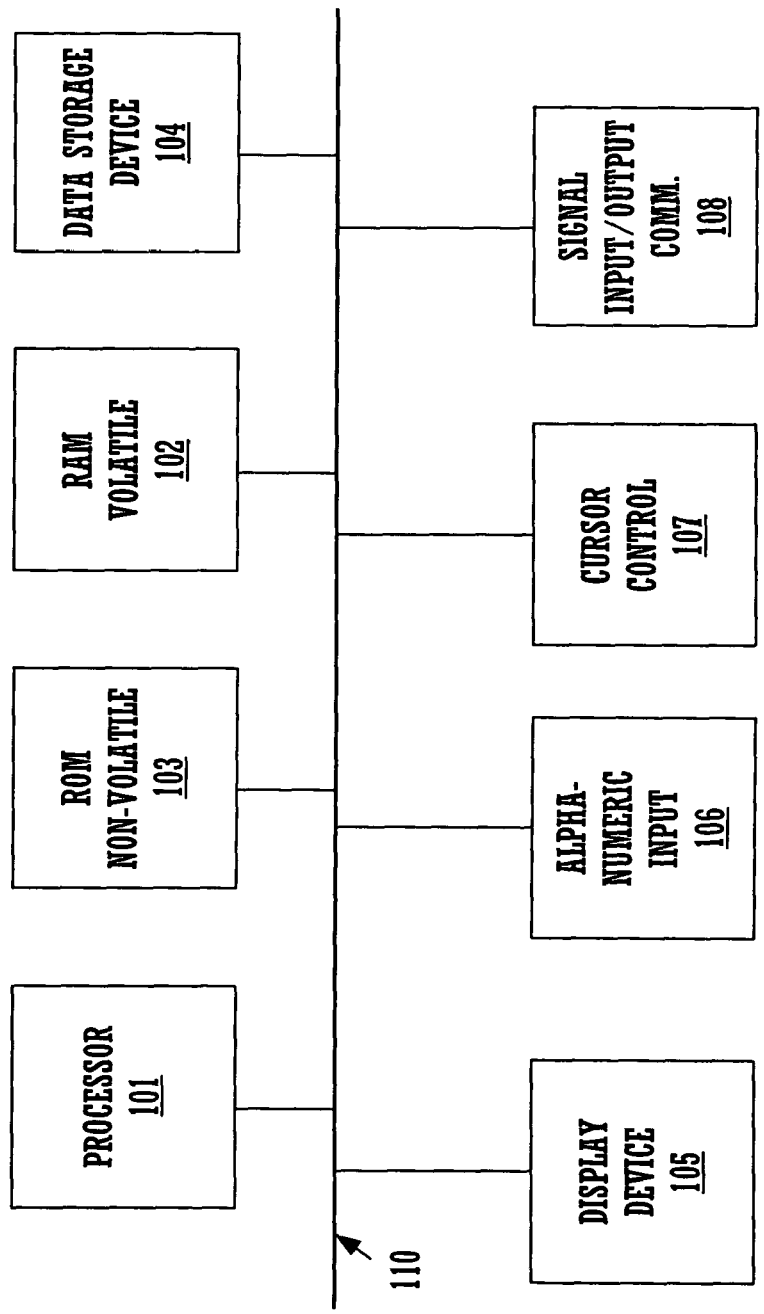

USING STANDARD PATTERN TILES AND CUSTOM PATTERN TILES TO GENERATE A SEMICONDUCTOR DESIGN LAYOUT HAVING A DEEP WELL STRUCTURE FOR ROUTING BODY-BIAS VOLTAGE

CROSS REFERENCE TO RELATED APPLICATIONS

This patent application is a Continuation of U.S. patent application Ser. No. 11/193,723, now U.S. Pat. No. 7,305,647 filed on Jul. 28, 2005, which is hereby incorporated by reference in its entirety.

BACKGROUND OF THE INVENTION

1. Field of the Invention

The present invention generally relates to semiconductor devices. More particularly, the present invention relates to the field of using standard pattern tiles and custom pattern tiles to generate a semiconductor design layout having a deep well structure for routing body-bias voltage.

2. Related Art

Generation of the physical layout of a semiconductor device having MOSFETS (metal oxide semiconductor field effect transistors) formed on a semiconductor substrate is a challenging task. An extensive amount of time and resources are spent during the creation of the physical layout. However, consumption of resources can be minimized if new physical layouts utilize substantial portions of existing physical layouts. For example, a new physical layout having MOSFETS that are body-biased would be less expensive to generate if an existing physical layout having MOSFETS without body-bias is utilized and modified according to the needs of the new physical design. Unfortunately, this process of modifying the existing physical layout typically requires forming an additional routing layer for the body-bias voltage on the surface of the semiconductor device, creating a serious issue since the existing physical layout utilizes most, if not all, available surface area.

SUMMARY OF THE INVENTION

A semiconductor design layout having a deep well structure for routing body-bias voltage is generated using standard pattern tiles and custom pattern tiles. These tiles have a tile shape and a tile size that fit an integer number of times into a grid unit of a grid for the semiconductor design layout.

BRIEF DESCRIPTION OF THE DRAWINGS

The accompanying drawings, which are incorporated in and form a part of this specification, illustrate embodiments of the invention and, together with the description, serve to explain the principles of the present invention.

FIG. 17 illustrates an exemplary computer system on which embodiments of the present invention may be practiced.

DETAILED DESCRIPTION OF THE INVENTION

Reference will now be made in detail to embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details.

A deep well structure for routing body-bias voltage will be described in detail, wherein the deep well structure is a conductive sub-surface structure. Then, a method of generating a semiconductor design layout having a deep well structure for routing body-bias voltage using standard pattern tiles and custom pattern tiles will be described in detail.

Deep Well Structure for Routing Body-Bias Voltage

Although the following description of the present invention will focus on routing a body-bias voltage to pFETS (or p-type MOSFETS) formed in surface N-wells via a conductive sub-surface region of N-type doping when a p-type substrate and an N-well process are utilized, the present invention is equally applicable to routing a body-bias voltage to nFETS (or n-type MOSFETS) formed in surface P-wells via a conductive sub-surface region of P-type doping when an n-type substrate and a P-well process are utilized.

Figure 1:
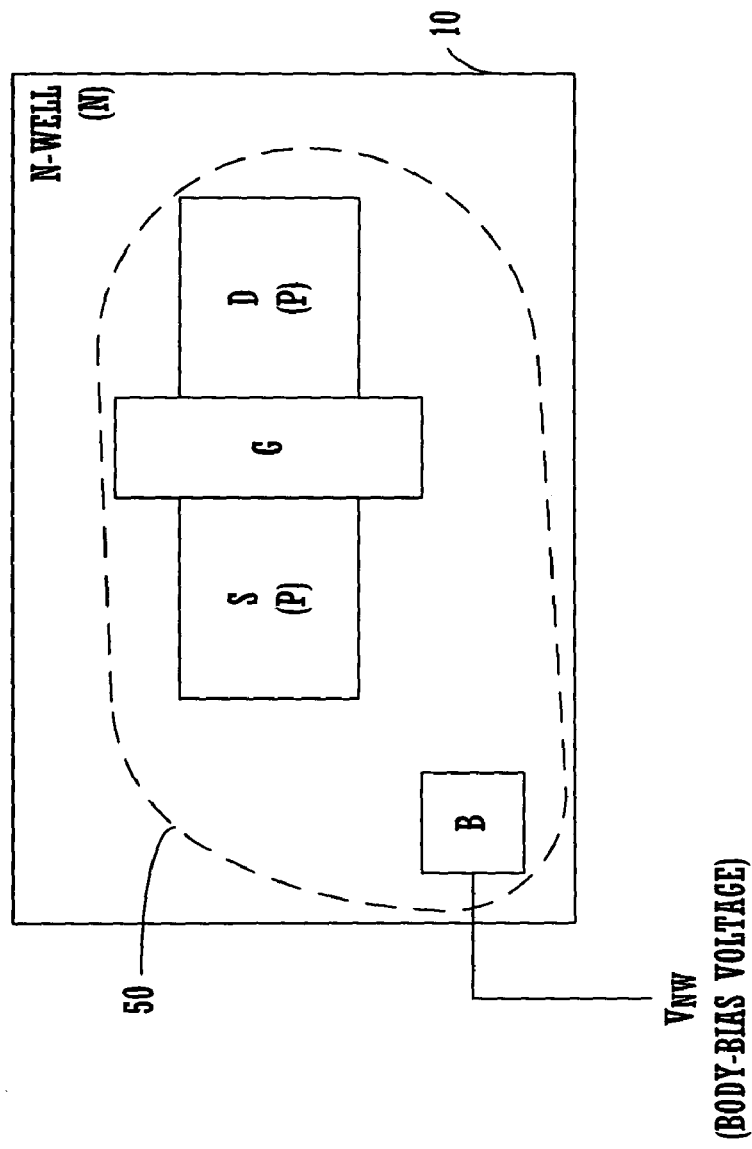
FIG. 1 illustrates a top view of a pFET formed in an N-well in accordance with an embodiment of the present invention, showing the pFET having a body-bias voltage Vnw applied to its bulk/body B terminal.

FIG. 1 illustrates a top view of a pFET 50 (or p-type MOSFET) formed in an N-well 10 when a p-type substrate and an N-well process are utilized in accordance with an embodiment of the present invention, wherein the pFET 50 has a body-bias voltage Vnw applied to its bulk/body B terminal. As depicted in FIG. 1, the pFET 50 has gate G, drain D (p-type doping), source S (p-type doping), and bulk/body B terminals. In particular, the bulk/body B terminal is coupled to the N-well 10. Hence, a voltage applied to the bulk/body B terminal is received by the N-well 10. The N-well 10 has an n-type doping. Regions of a semiconductor device that are doped with an n-type dopant have one type of conductivity while regions that are doped with a p-type dopant have another type of conductivity. Typically, various dopant concentrations are utilized in different regions of the semiconductor device.

The pFET 50 is body-biased to influence its performance. Without body-biasing, the source S and bulk/body B terminals are coupled together. With body-biasing, the source S and bulk/body B terminals are not coupled together. Body-biasing enables controlling the potential difference between the source S and bulk/body B terminals of the pFET 50, providing the ability to electrically tune the threshold voltage level of the pFET 50.

In the case of body-biasing, the bulk/body B terminal receives a body-bias voltage Vnw. As described above, the bulk/body B terminal represents a connection to the N-well 10. Thus, the body-bias voltage Vnw is applied to the N-well 10.

Rather than generating an entire new physical layout for a semiconductor device to support the pFET 50 having the body-bias voltage Vnw, an existing physical layout can be modified. In particular, the existing physical layout is modified by including a deep N-well region to route the body-bias voltage Vnw to the N-wells 10 which generally are separated by P-well regions, wherein the deep N-well represents a conductive sub-surface well layer that is beneath the surface N-well 10. This avoids the need to create another surface routing layer on a surface of the semiconductor device that does not have much free surface area for additional routing.

Several layout patterns for the deep N-well region are described herein. These layout patterns facilitate routing the body-bias voltage in the semiconductor device. The layout patterns include a diagonal sub-surface mesh structure (see FIG. 5A), an axial sub-surface mesh structure (see FIG. 7), a diagonal sub-surface strip structure (see FIG. 6A and FIG. 6B), and an axial sub-surface strip structure (see FIG. 8A and FIG. 8B). A particular layout pattern is selected for an area of the semiconductor device according to several factors as will be described below. Once the particular layout pattern is selected, the layout for the deep N-well region can be generated in an automated manner.

The body-bias voltage Vnw is routed to the N-wells via one or more deep N-well regions (which are conductive sub-surface well layers) as opposed to surface metal layers. In one embodiment, the deep N-well region is a diagonal deep N-well region as will be described below. In another embodiment, the deep N-well region is an axial deep N-well region as will be described below. The advantage of this approach is that while typically there is little or no room on the densely packed surface area of the semiconductor device for extra metal routing layers, the area beneath the surface of the semiconductor device is often underutilized due to the fact that routing signals through wells is generally prohibited by the poor frequency response and potentially unfavorable resistance of the wells. In the present invention, rather than carrying signals, the deep N-well regions serve to hold and distribute the body-bias voltage Vnw.

Further description of the deep N-well regions can be found in the patent application entitled "METHOD AND APPARATUS FOR OPTIMIZING BACK-BIAS CONNECTIONS IN CMOS CIRCUITS USING A DEEP N-WELL GRID STRUCTURE", U.S. patent application Ser. No. 10/683,961, now U.S. Pat. No. 7,174,528 filed on Oct. 10, 2003 by James B. Burr and William Schnaitter, and in the patent application entitled "LAYOUT PATTERNS FOR DEEP WELL REGION TO FACILITATE ROUTING BODY-BIAS VOLTAGE", U.S. patent application Ser. No. 10/683,732, now U.S. Pat. No. 7,098,512 filed on Oct. 10, 2003 by Michael Pelham and James B. Burr, which are assigned to the assignee of the present patent application, and which are incorporated by reference in their entirety herein.

Figure 2A:
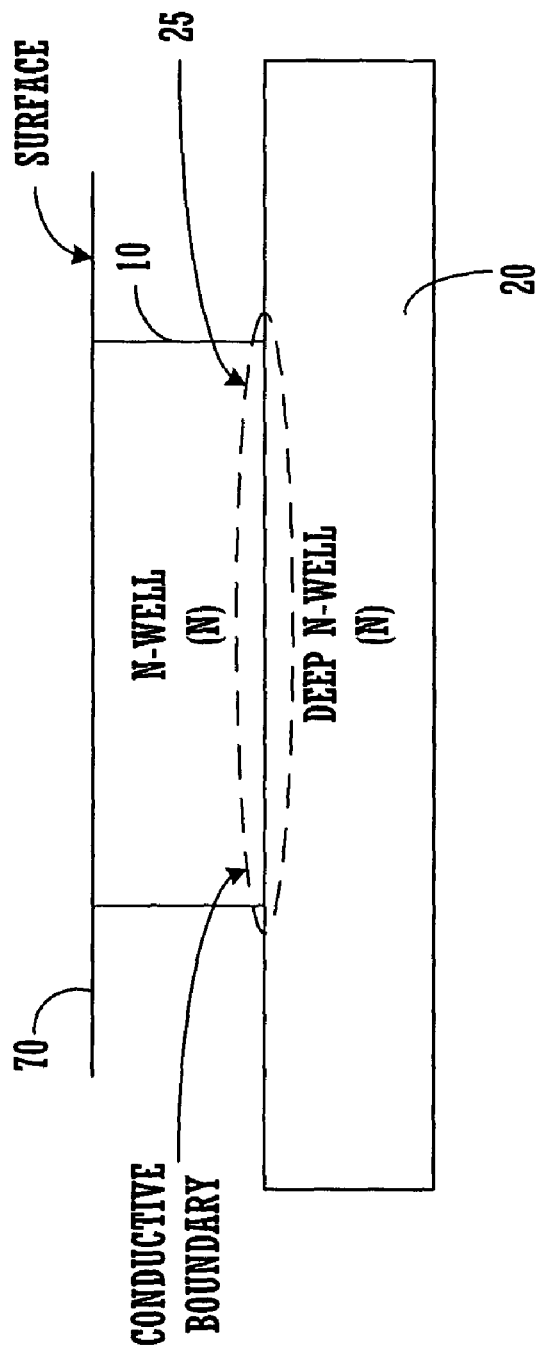
FIG. 2A illustrates the relative positioning of an N-well and a deep N-well region beneath a surface of a semiconductor device in accordance with an embodiment of the present invention.

FIG. 2A illustrates the relative positioning of an N-well 10 (also known as a surface N-well) and a deep N-well region 20 beneath a surface 70 of a semiconductor device in accordance with an embodiment of the present invention. The N-well 10 is formed beneath the surface 70 of the semiconductor device and has an N-type doping. The deep N-well region 20 is formed beneath the N-well 10 such that the deep N-well region 20 and the N-well 10 share a sub-surface conductive boundary 25 that allows the deep N-well region 20 to function like a conductive sub-surface routing layer for routing the body-bias voltage Vnw to the N-wells. That is, the deep N-well region 20 contacts the N-well 10 along the sub-surface conductive boundary 25. Moreover, the deep N-well region 20 is buried under the surface 70 of the semiconductor device.

The deep N-well region 20 has an N-type doping. It should be understood that if an n-type substrate and a P-well process were utilized, a deep well of P-type doping would be utilized to function as a conductive sub-surface routing layer for routing the body-bias voltage to the surface P-wells.

The dimensions and size of the sub-surface conductive boundary 25 determine the resistance of the conductive path between the N-well 10 and the deep N-well region 20. As the size of the sub-surface conductive boundary 25 is increased, the resistance of the sub-surface conductive path between the N-well 10 and the deep N-well region 20 is lowered to create a low-resistance conductive path.

Figure 2B:
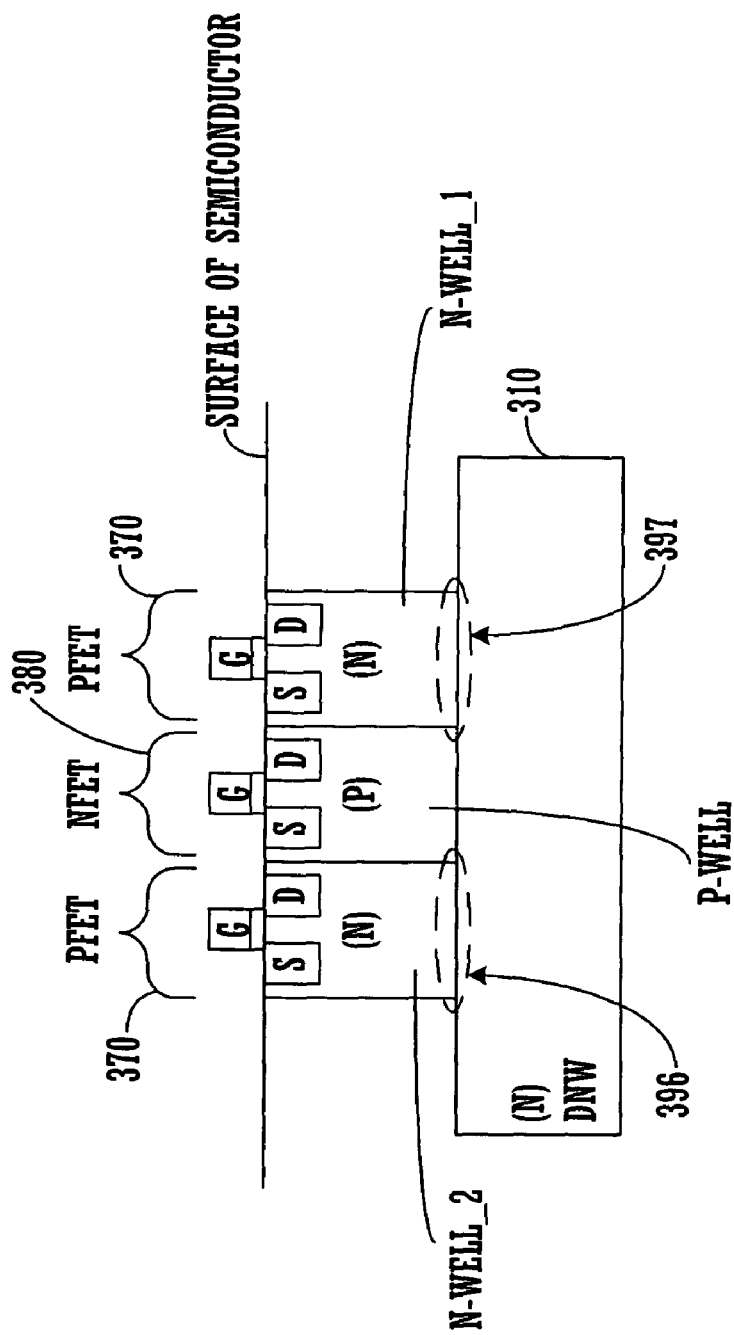
FIG. 2B illustrates a side view of a deep N-well region coupled to the N-well_1 and the N-well_2 in accordance with an embodiment of the present invention, showing the routing of the body-bias voltage.

FIG. 2B illustrates a side view of a deep N-well region coupled to the N-well_1 and the N-well_2 in accordance with an embodiment of the present invention, showing the routing of the body-bias voltage. As illustrated in FIG. 2B, there is a first sub-surface conductive boundary 396 between the N-well_1 and the deep N-well region 310. Moreover, there is a second sub-surface conductive boundary 397 between the N-well_2 and the deep N-well region 310. The surface N-well_1 has a PFET 370. Also, the surface N-well_2 has a PFET 370. The P-well region has an NFET 380 and separates the N-well_1 and the N-well_2. The body-bias voltage Vnw is routed to the N-well_1 and the N-well_2 via the first and second sub-surface conductive boundaries 396 and 397.

Figure 3A:
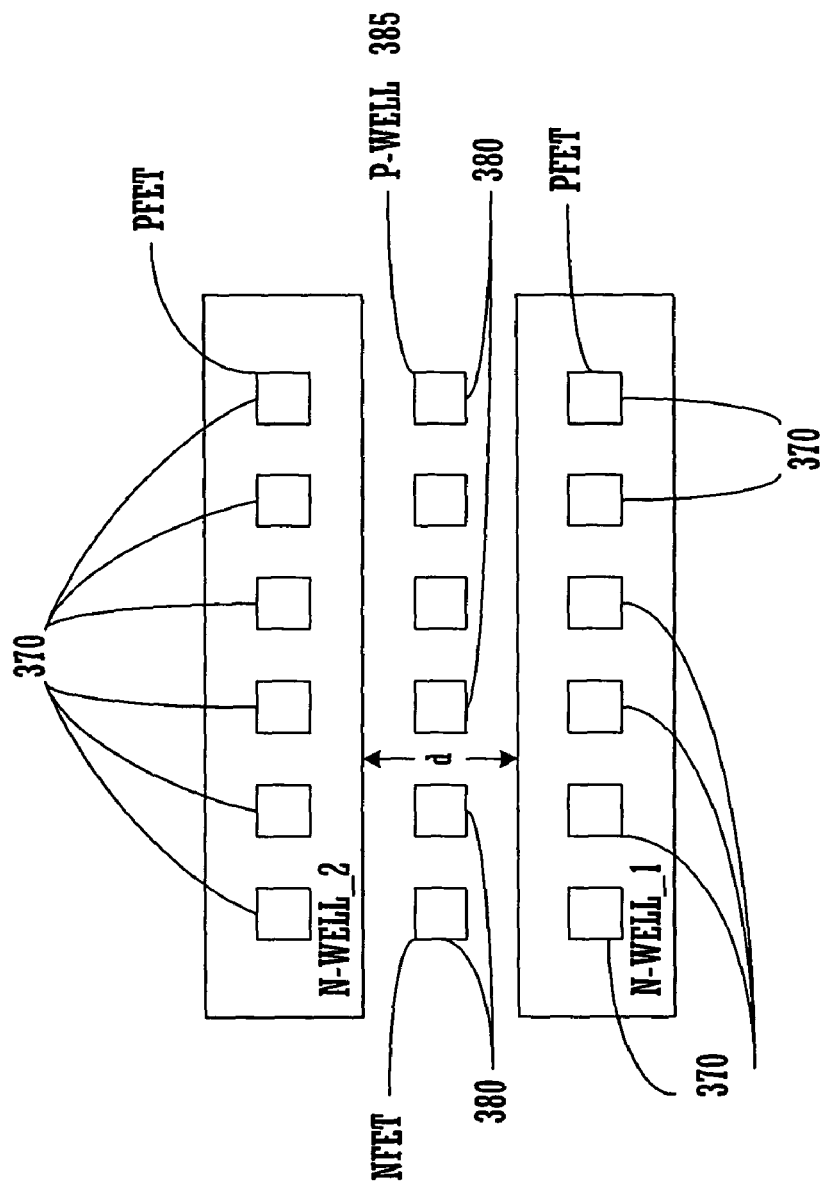
FIG. 3A illustrates a top view of a first arrangement of the N-well_1 and the N-well_2 in accordance with an embodiment of the present invention.

A top view of a first arrangement of the N-well_1 and the N-well_2 in accordance with an embodiment of the present invention is illustrated in FIG. 3A. As depicted in FIG. 3A, the N-well_1 and the N-well_2 have an axial orientation. That is, the N-well_1 and the N-well_2 are positioned along an axis (e.g., x-axis). The N-well_1 and the N-well_2 have an N-type doping. The body-bias voltage Vnw is routed to the N-well_1 and the N-well_2 so that the pFETs 370 can be body-biased via the deep N-well region. Thus, a contact for the body-bias voltage Vnw can be formed wherever there is free surface area, such as above the N-well_1, the N-well_2, or deep N-well region. Since the N-well_1 and the N-well_2 are separated by a P-type region or P-well region 385 on which the nFETS 380 are formed, the layout pattern of the deep N-well is carefully selected to avoid isolating the P-type region or P-well region 385 on which the nFETS 380 are formed, allowing the formation of conductive paths between the P-well region 385 and a sub-surface layer (e.g., doped with P-type material) that is formed beneath the deep N-well region. Here, the N-well_1 and the N-well_2 are separated by the length d.

Figure 3B:
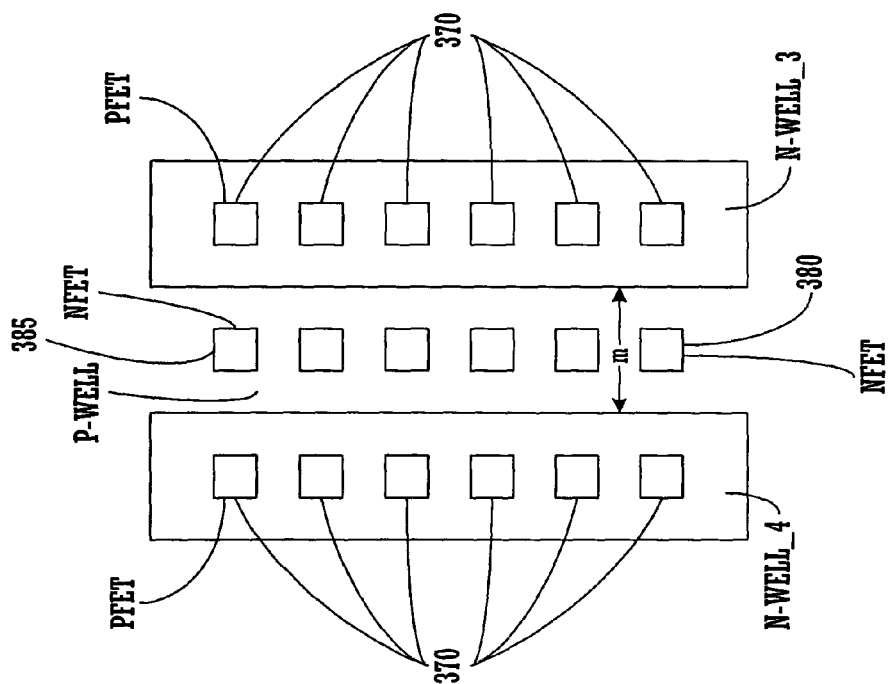
FIG. 3B illustrates a top view of a second arrangement of the N-well_3 and the N-well_4 in accordance with an embodiment of the present invention.

FIG. 3B illustrates a top view of a second arrangement of the N-well_3 and the N-well_4 in accordance with an embodiment of the present invention. As depicted in FIG. 3B, the N-well_3 and the N-well_4 have an axial orientation. That is, the N-well_3 and the N-well_4 are positioned along an axis (e.g., y-axis). The N-well_3 and the N-well_4 have an N-type doping. The body-bias voltage Vnw is routed to the N-well_3 and the N-well_4 so that the pFETs 370 can be body-biased via the deep N-well region. Thus, a contact for the body-bias voltage Vnw can be formed wherever there is free surface area, such as above the N-well_3, the N-well_4, or deep N-well region. Since the N-well_3 and the N-well_4 are separated by a P-type region or P-well region 385 on which the nFETS 380 are formed, the layout pattern of the deep N-well is carefully selected to avoid isolating the P-type region or P-well region 385 on which the nFETS 380 are formed, allowing the formation of conductive paths between the P-well region 385 and a sub-surface layer (e.g., doped with P-type material) that is formed beneath the deep N-well region. Here, the N-well_3 and the N-well_4 are separated by the length m.

Figure 4:
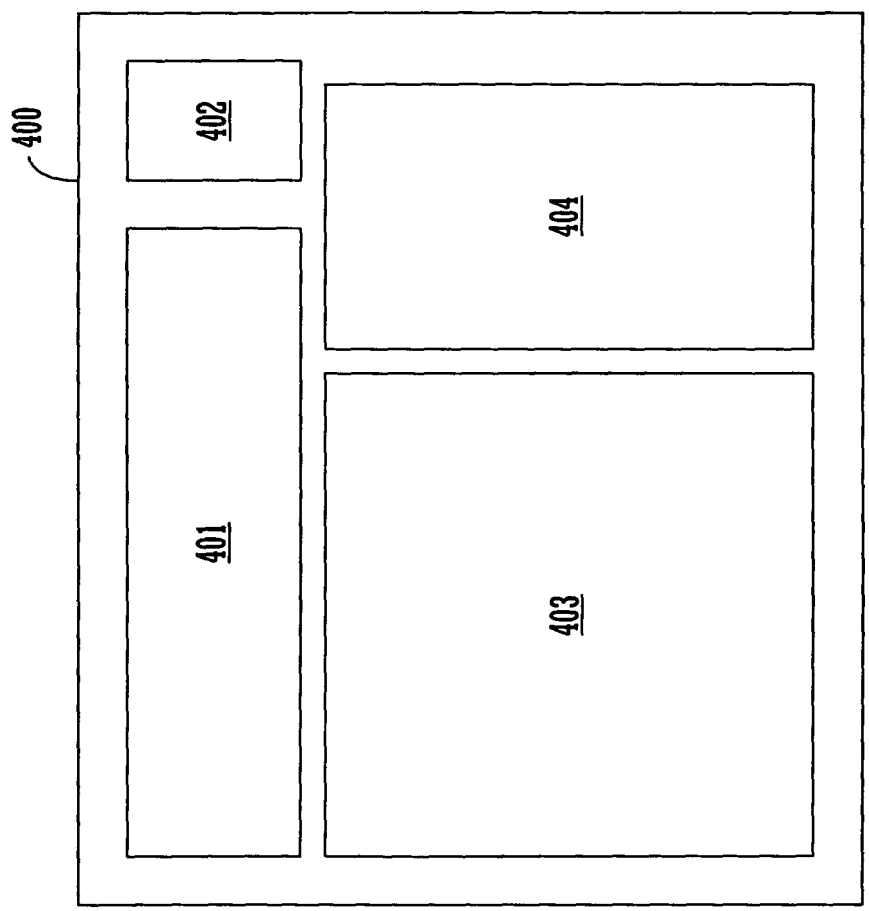
FIG. 4 illustrates a top view of a semiconductor device in accordance with an embodiment of the present invention, showing multiple areas each area corresponding to a separate layout pattern for the deep N-well.

FIG. 4 illustrates a top view of a semiconductor device 400 in accordance with an embodiment of the present invention, showing multiple areas 401-404 each area corresponding to a separate layout pattern for the deep N-well. In general, the layout distribution of surface N-wells and surface P-type regions or P-wells on the semiconductor device 400 is characterized by particular patterns. The semiconductor device 400 can be divided according to these particular patterns into multiple areas 401-404.

Once the layout pattern of the surface N-wells and surface P-type regions or P-wells are recognized, a layout pattern for the deep N-well region can be selected for the particular area. The layout patterns for the deep N-well region include a diagonal sub-surface mesh structure (see FIG. 5A), an axial sub-surface mesh structure (see FIG. 7), a diagonal sub-surface strip structure (see FIG. 6A and FIG. 6B), and an axial sub-surface strip structure (see FIG. 8A and FIG. 8B). The factors evaluated in selecting a particular layout pattern for the deep N-well region include: providing a low resistance conductive path for routing the body-bias voltage and avoiding the isolation of the P-type region or P-well region 385 (FIGS. 3A and 3B) on which the nFETS 380 are formed to allow the formation of conductive paths between the P-well region 385 and a sub-surface layer (e.g., doped with P-type material) that is formed beneath the deep N-well region.

Moreover, the primary factors in determining which particular layout pattern for the deep N-well region to use is the type of layout pattern (e.g., horizontal strips or vertical strips) of the surface N-wells (see FIGS. 3A and 3B) and the separation length between adjacent surface N-wells (e.g., separation length d in FIG. 3A, and separation length m in FIG. 3B). Since each type of layout pattern of the surface N-wells (see FIGS. 3A and 3B) exhibits unique characteristics, a layout pattern for the deep N-well region is selected that is appropriate for those characteristics exhibited by the layout pattern of the surface N-wells. Within each area 401-404, adjustments to the layout pattern of the deep N-well can be made to overcome any violations of the layout design rules and to improve the factors described above.

Figure 5A:
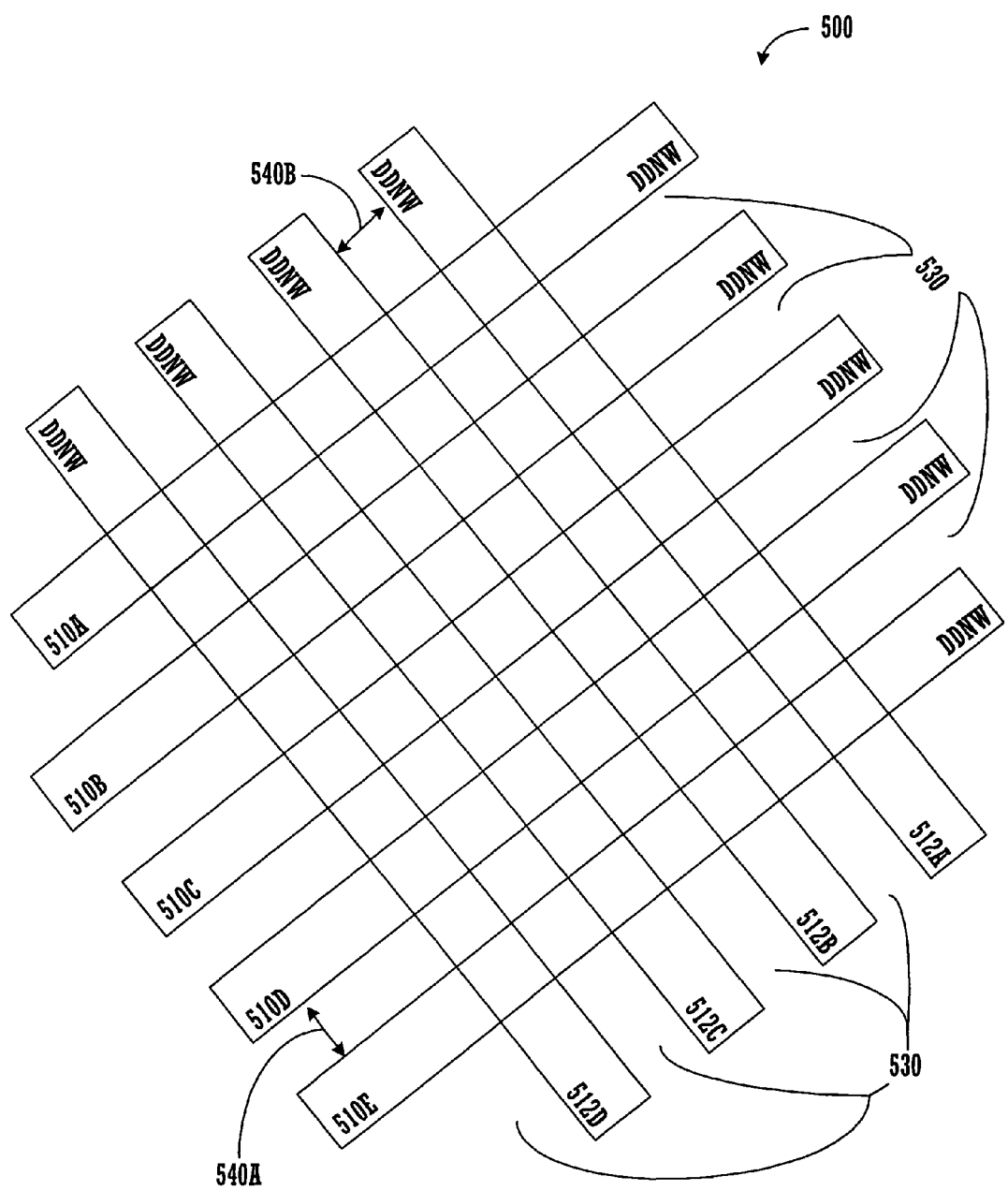
FIG. 5A illustrates a top view of multiple diagonal deep N-well (DDNW) regions forming a diagonal sub-surface mesh structure in accordance with an embodiment of the present invention.

FIG. 5A illustrates a top view of multiple diagonal deep N-well (DDNW) regions forming a diagonal sub-surface mesh structure 500 in accordance with an embodiment of the present invention. Rather than having a continuous planar layer for the deep N-well, multiple diagonal deep N-well (DDNW) regions are patterned according to a layout pattern. As depicted in FIG. 5A, each diagonal deep N-well region 510A-510E and 512A-512D has a strip shape, is formed beneath the surface N-well layer of a semiconductor device, and is doped with an N-type material. The diagonal deep N-well regions 510A-510E are formed in a first parallel orientation while the diagonal deep N-well regions 512A-512D are formed in a second parallel orientation. The first parallel orientation and the second parallel orientation are orthogonal to each other and are diagonal (or slanted) with respect to the N-well regions of FIGS. 3A and 3B. In an embodiment, the first parallel orientation and the N-well regions of FIGS. 3A and 3B form an angle that is approximately 45 degrees. Additionally, in an embodiment, the second parallel orientation and the N-well regions of FIGS. 3A and 3B form an angle that is approximately 45 degrees. Thus, the diagonal deep N-well regions 510A-510E and 512A-512D form a diagonal sub-surface mesh structure 500 for routing the body-bias voltage Vnw to the N-well regions so that the pFETs can be body-biased.

As described above with respect to FIGS. 2A and 2B, the layer corresponding to the deep N-well region is below the layer corresponding to the surface N-well regions. Hence, sub-surface conductive boundaries can be formed between the N-well regions and the diagonal sub-surface mesh structure 500 to provide a plurality of sub-surface conductive paths between N-well regions without isolating the P-well region located between the N-wells. That is, the diagonal sub-surface mesh structure 500 contacts the N-wells along the sub-surface conductive boundaries (e.g., sub-surface conductive boundary 25 (FIG. 2A) and sub-surface conductive boundaries 396 and 397 (FIG. 2B)).

The orientation of the diagonal sub-surface mesh structure 500 is diagonal with respect to the orientation of the N-well regions of FIGS. 3A and 3B. In an embodiment, the diagonal sub-surface mesh structure 500 is rotated approximately 45 degrees with respect to the N-well regions of FIGS. 3A and 3B. It should be understood that the diagonal sub-surface mesh structure 500 can have other configurations. For example, the gaps 540A and 540B between adjacent diagonal deep N-well regions can vary in size. Moreover, the ratio of diagonal deep N-well regions to gap area 430 can vary.

Additionally, the diagonal sub-surface mesh structure 500 enables the nFETS (n-type MOSFETS) 380 (FIGS. 3A and 3B) to be body-biased in a manner that prevents isolation of a P-type region or P-well region 385 (FIGS. 3A and 3B) on which the nFETS 380 are formed. The gap area 530 between diagonal deep N-well regions 510A-510E and 512A-512D prevent isolation of the P-well region 385 and enable a conductive path between the P-well region 385 and a sub-surface layer that is beneath the diagonal deep N-well regions 510A-510E and 512A-512D. In an embodiment, the area of the diagonal sub-surface mesh structure 500 is equally divided between diagonal deep N-well regions (e.g., 510A-510E and 512A-512D) and gap area 530.

As discussed above, a contact for the body-bias voltage Vnw can be formed wherever there is free space, such as above the N-well regions or above the diagonal deep N-well regions 510A-510E and 512A-512D. Moreover, the location and size of the diagonal sub-surface mesh structure 500 is based on the distribution of the N-wells and the P-type regions or P-wells, wherein the goal is to provide low resistance conductive paths for the body-bias voltage Vnw.

However, the size of the diagonal sub-surface mesh structure 500 should avoid isolating the P-type regions or P-wells 385 (FIGS. 3A and 3B) from sub-surface layers that are formed beneath the diagonal deep N-well regions 510A-510E and 512A-512D. Moreover, the gap area 530 is sized so that to provide a low-resistance conductive path between the P-type regions or P-wells 385 and a sub-surface layer that is formed beneath the diagonal deep N-well regions, wherein the greater the gap area 530 the lower the resistance of this conductive path. Additionally, lateral diffusion and lateral depletion can further reduce the gap area 530, potentially pinching-off this conductive path between the P-type regions or P-wells 385 and a sub-surface layer that is formed beneath the diagonal deep N-well regions. As a solution to this situation, the gaps 540A and 540B between adjacent diagonal deep N-well regions are made sufficiently wide to avoid pinching-off this conductive path between the P-type regions or P-wells 385 and a sub-surface layer that is formed beneath the diagonal deep N-well regions. Yet, as the number and size of the diagonal deep N-well regions are increased, the resistance of the conductive path for routing the body-bias voltage Vnw is decreased because there are larger and more sub-surface conductive boundaries between the N-well regions and the diagonal deep N-well regions. Hence, there is a trade-off between the gap area 530 and the diagonal deep N-well regions in each design situation.

Figure 5B:
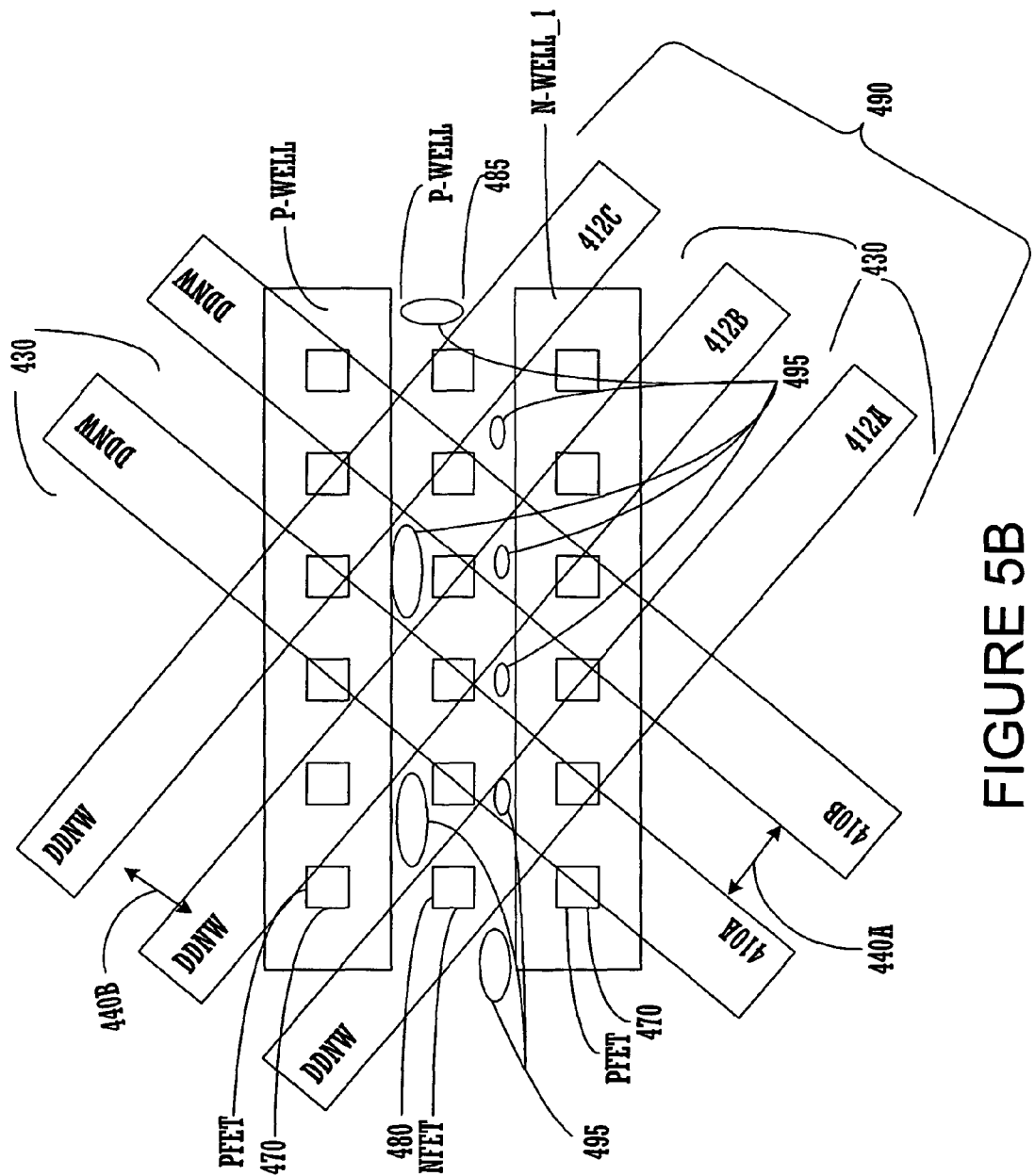
FIG. 5B illustrates a top view of multiple N-wells and multiple diagonal deep N-well (DDNW) regions forming a diagonal sub-surface mesh structure in accordance with an embodiment of the present invention.

FIG. 5B illustrates a top view of multiple N-wells (e.g., N-well_1 and the N-well_2) and multiple diagonal deep N-well (DDNW) regions forming a diagonal sub-surface mesh structure in accordance with an embodiment of the present invention. Here, the diagonal deep N-well regions 410A and 410B are orthogonal to the diagonal deep N-well regions 412A, 412B, and 412C. Thus, the diagonal deep N-well regions 412A, 412B, 412C, 410A, and 410B form a diagonal sub-surface mesh structure 490 for routing the body-bias voltage Vnw to the N-well_1 and the N-well_2 so that the pFETs 470 can be body-biased. In an embodiment, the area of the diagonal sub-surface mesh structure 490 is equally divided between diagonal deep N-well regions and gap area 430.

It should be understood that the diagonal sub-surface mesh structure 490 can have other configurations. The gaps 440A and 440B between adjacent diagonal deep N-well regions can vary in size. Moreover, the ratio of diagonal deep N-well regions to gap area 430 can vary. The regions 495 between diagonal deep N-well regions prevent isolation of the P-well region 485 and enable a conductive path between the P-well region 485 and a sub-surface layer that is beneath the diagonal deep N-well regions 412A, 412B, 412C, 410A, and 410B.

Figure 6A:
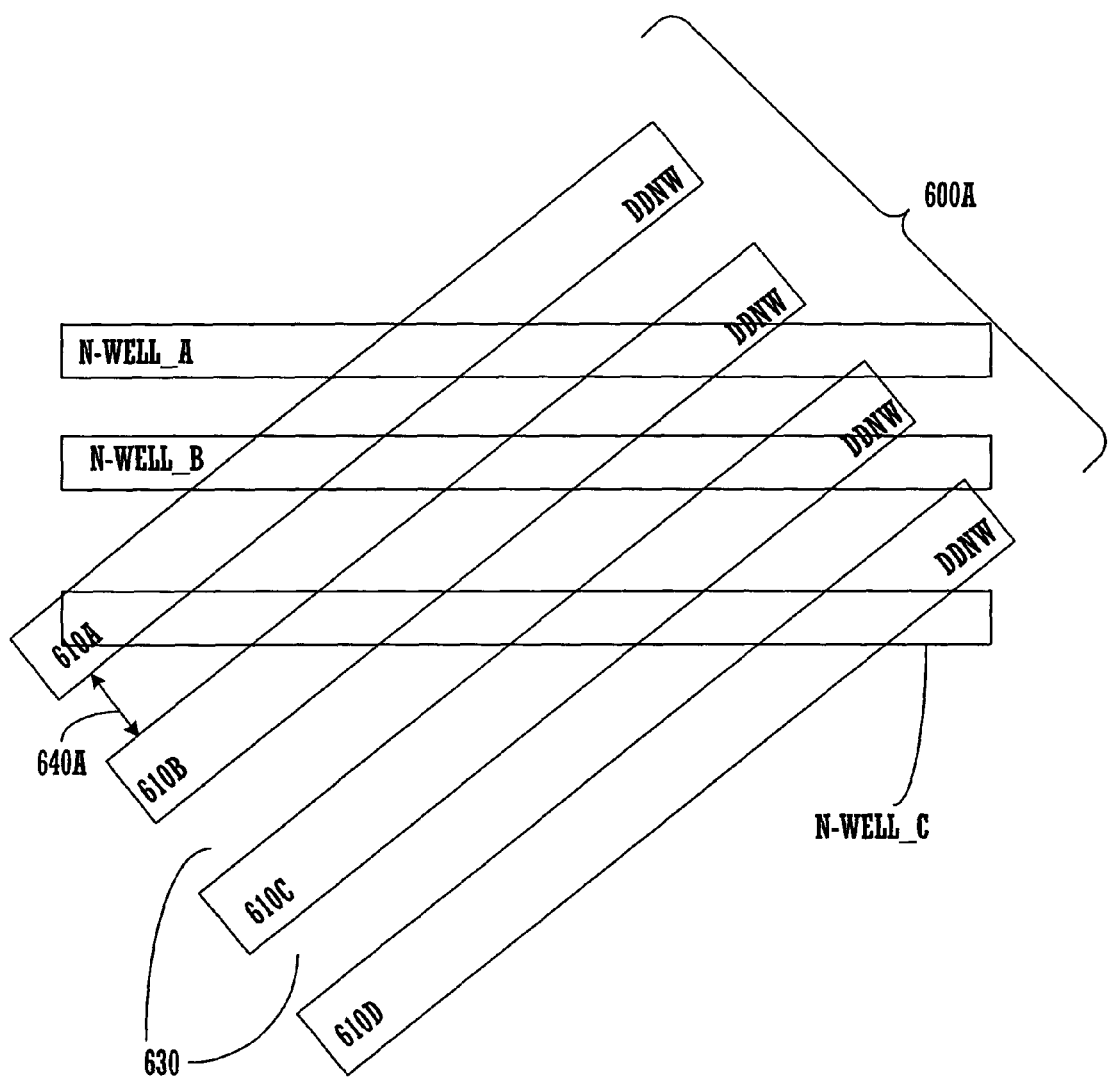
FIG. 6A illustrates a top view of multiple diagonal deep N-well (DDNW) regions forming a first diagonal sub-surface strip structure in accordance with an embodiment of the present invention.

A top view of multiple diagonal deep N-well (DDNW) regions forming a first diagonal sub-surface strip structure 600A in accordance with an embodiment of the present invention is illustrated in FIG. 6A. In this layout pattern, each diagonal deep N-well region 610A-610D has a strip shape, is formed beneath the surface N-well layer of a semiconductor device, and is doped with an N-type material. The diagonal deep N-well regions 610A-610D are formed in a first parallel orientation. The first parallel orientation is diagonal (or slanted) with respect to the surface N-well regions (e.g., N-well_A, N-well_B, and N-well_C). In an embodiment, the first parallel orientation and the N-well regions form an angle that is approximately 45 degrees. In this case, the combination of the surface N-well regions (e.g., N-well_A, N-well_B, and N-well_C) and the first diagonal sub-surface strip structure 600A forms a mesh-type arrangement for routing the body-bias voltage to the surface N-well regions so that the pFETs can be body-biased.

As described above with respect to FIGS. 2A and 2B, the layer corresponding to the deep N-well region is below the layer corresponding to the surface N-well regions. Hence, sub-surface conductive boundaries can be formed between the N-well regions and the first diagonal sub-surface strip structure 600A to provide a plurality of sub-surface conductive paths between N-well regions without isolating the P-well region located between the N-wells. That is, the first diagonal sub-surface strip structure 600A contacts the N-wells along the sub-surface conductive boundaries (e.g., sub-surface conductive boundary 25 (FIG. 2A) and sub-surface conductive boundaries 396 and 397 (FIG. 2B)).

As described above, the combination of the surface N-well regions (e.g., N-well_A, N-well_B, and N-well_C) and diagonal deep N-well regions 610A-610D, which form the first diagonal sub-surface strip structure 600A, facilitate the routing of the body-bias voltage Vnw to the N-well regions so that the pFETs can be body-biased. The first diagonal sub-surface strip structure 600A can be utilized in areas of the semiconductor device that have a dense layout such as areas corresponding to a SRAM (static random access memory). It should be understood that the first diagonal sub-surface strip structure 600A can have other configurations. The gap 640A between adjacent diagonal deep N-well regions can vary in size. Moreover, the ratio of diagonal deep N-well regions to gap area 630 can vary.

Figure 6B:
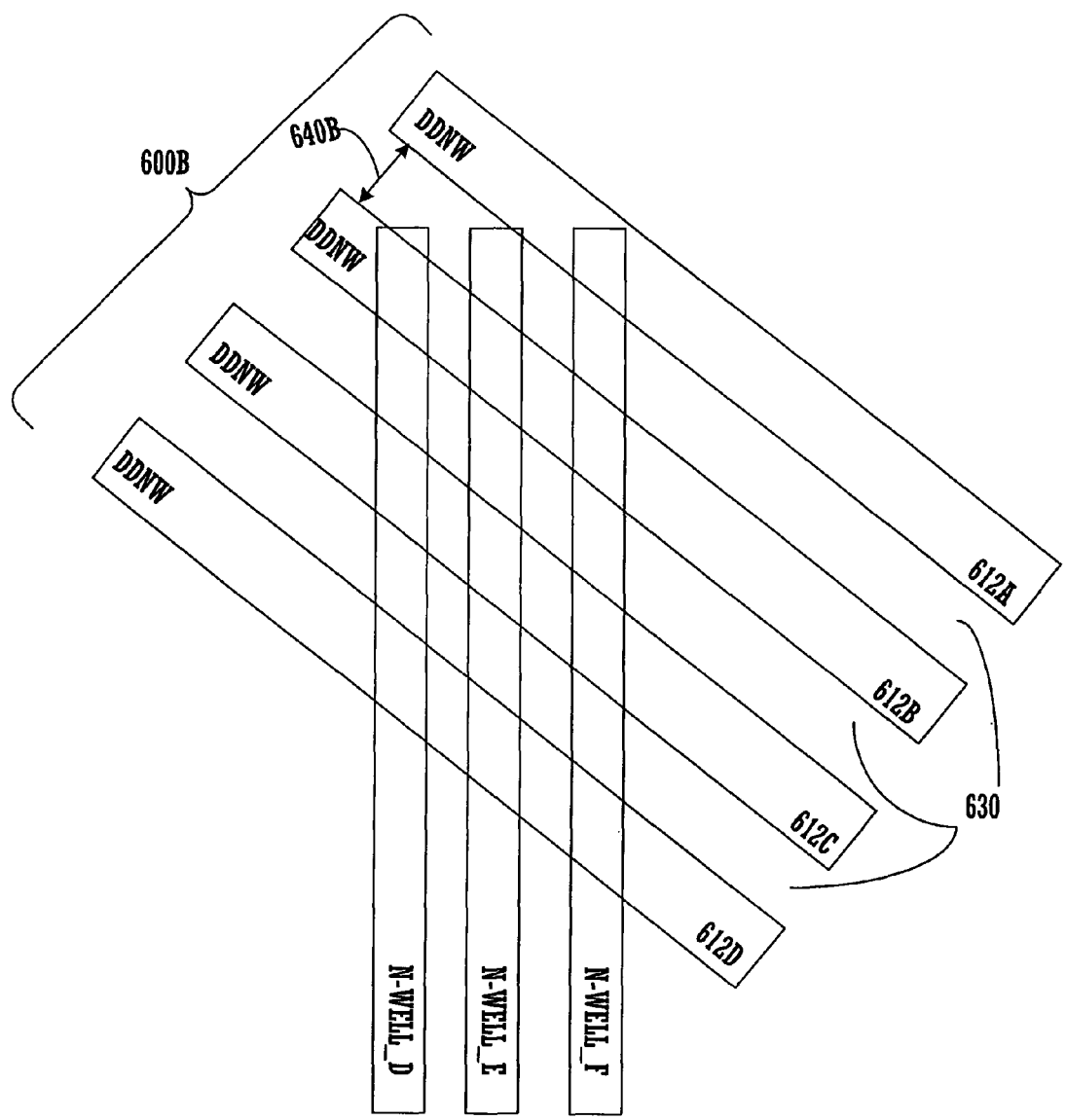
FIG. 6B illustrates a top view of multiple diagonal deep N-well (DDNW) regions forming a second diagonal sub-surface strip structure in accordance with an embodiment of the present invention.

FIG. 6B illustrates a top view of multiple diagonal deep N-well (DDNW) regions forming a second diagonal sub-surface strip structure 600B in accordance with an embodiment of the present invention. In this layout pattern, each diagonal deep N-well region 612A-612D has a strip shape, is formed beneath the surface N-well layer of a semiconductor device, and is doped with an N-type material. The diagonal deep N-well regions 612A-612D are formed in a second parallel orientation. The second parallel orientation is diagonal (or slanted) with respect to the surface N-well regions (e.g., N-well_D, N-well_E, and N-well_F). In an embodiment, the second parallel orientation and the N-well regions form an angle that is approximately 45 degrees. In this case, the combination of the surface N-well regions (e.g., N-well_D, N-well_E, and N-well_F) and the second diagonal sub-surface strip structure 600B forms a mesh-type arrangement for routing the body-bias voltage to the surface N-well regions so that the pFETs can be body-biased.

As described above with respect to FIGS. 2A and 2B, the layer corresponding to the deep N-well region is below the layer corresponding to the surface N-well regions. Hence, sub-surface conductive boundaries can be formed between the N-well regions and the second diagonal sub-surface strip structure 600B to provide a plurality of sub-surface conductive paths between N-well regions without isolating the P-well region located between the N-wells. That is, the second diagonal sub-surface strip structure 600B contacts the N-wells along the sub-surface conductive boundaries (e.g., sub-surface conductive boundary 25 (FIG. 2A) and sub-surface conductive boundaries 396 and 397 (FIG. 2B)).

As described above, the combination of the surface N-well regions (e.g., N-well_D, N-well_E, and N-well_F) and diagonal deep N-well regions 612A-612D, which form the second diagonal sub-surface strip structure 600B, facilitate routing of the body-bias voltage Vnw to the N-well regions so that the pFETs can be body-biased. The second diagonal sub-surface strip structure 600B can be utilized in areas of the semiconductor device that have a dense layout such as areas corresponding to a SRAM (static random access memory). It should be understood that the second diagonal sub-surface strip structure 600B can have other configurations. The gap 640B between adjacent diagonal deep N-well regions can vary in size. Moreover, the ratio of diagonal deep N-well regions to gap area 630 can vary.

Figure 7:
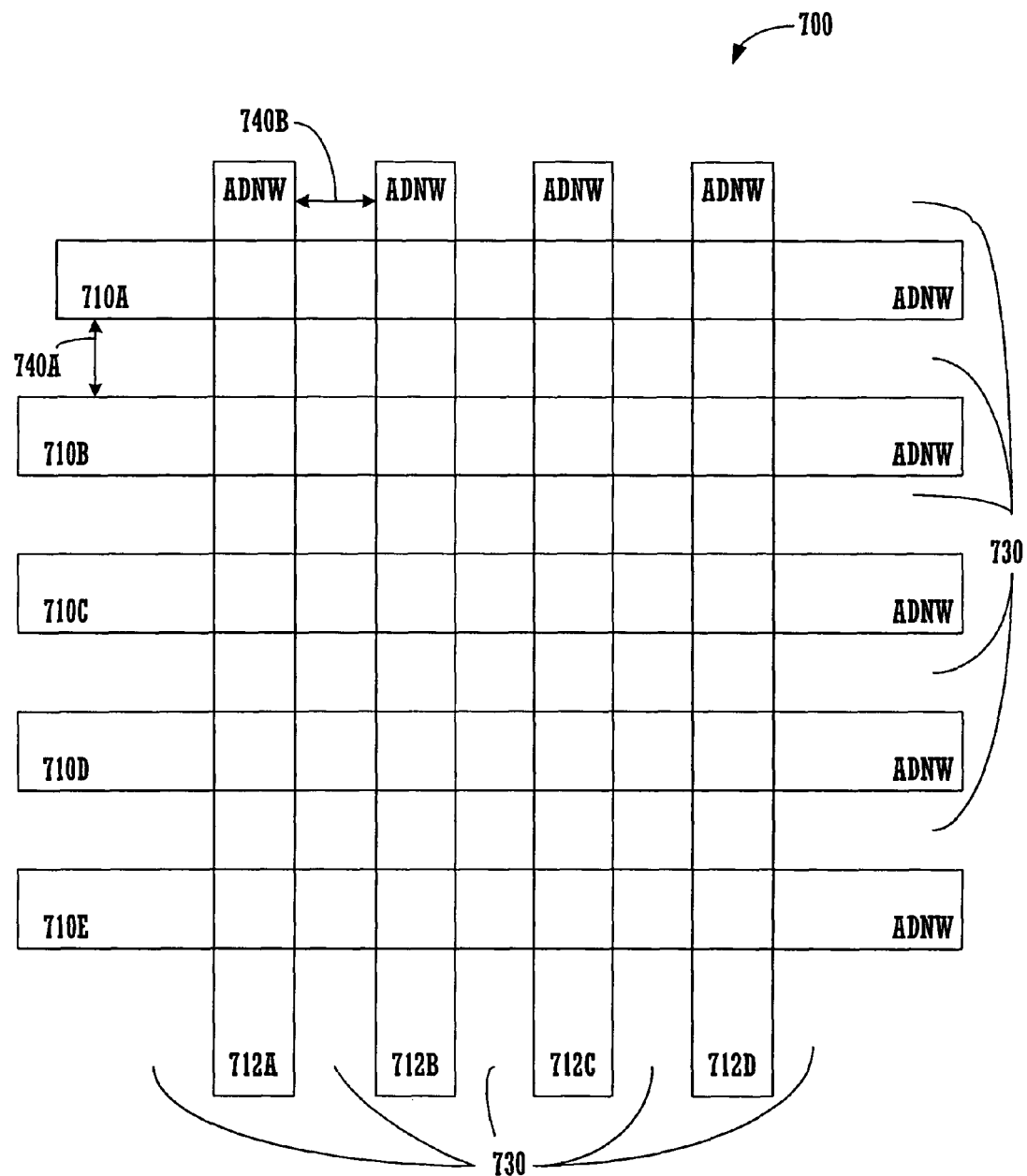
FIG. 7 illustrates a top view of multiple axial deep N-well (ADNW) regions forming an axial sub-surface mesh structure in accordance with an embodiment of the present invention.

FIG. 7 illustrates a top view of multiple axial deep N-well (ADNW) regions forming an axial sub-surface mesh structure 700 in accordance with an embodiment of the present invention. As depicted in FIG. 7, each axial deep N-well region 710A-710E and 712A-712D has a strip shape, is formed beneath the surface N-well layer of a semiconductor device, and is doped with an N-type material. The axial deep N-well regions 710A-710E are formed in a first parallel orientation while the diagonal deep N-well regions 712A-712D are formed in a second parallel orientation. The first parallel orientation and the second parallel orientation are orthogonal to each other and are axially positioned with respect to the N-well regions of FIGS. 3A and 3B. That is, the first parallel orientation and the second parallel orientation are oriented along an axis (e.g., y-axis or x-axis) in the same manner as the N-well regions of FIGS. 3A and 3B. In an embodiment, the first parallel orientation is parallel to the N-well regions of FIG. 3A and is perpendicular to the N-well regions of FIG. 3B. Additionally, in an embodiment, the second parallel orientation is parallel to the N-well regions of FIG. 3B and is perpendicular to the N-well regions of FIG. 3A. Thus, the axial deep N-well regions 710A-710E and 712A-712D form an axial sub-surface mesh structure 700 for routing the body-bias voltage Vnw to the N-well regions so that the pFETs can be body-biased.

As described above with respect to FIGS. 2A and 2B, the layer corresponding to the deep N-well region is below the layer corresponding to the surface N-well regions. Hence, sub-surface conductive boundaries can be formed between the N-well regions and the axial sub-surface mesh structure 700 to provide a plurality of sub-surface conductive paths between N-well regions without isolating the P-well region located between the N-wells. That is, the axial sub-surface mesh structure 700 contacts the N-wells along the sub-surface conductive boundaries (e.g., sub-surface conductive boundary 25 (FIG. 2A) and sub-surface conductive boundaries 396 and 397 (FIG. 2B)).

It should be understood that the axial sub-surface mesh structure 700 can have other configurations. For example, the gaps 740A and 740B between adjacent axial deep N-well regions can vary in size. Moreover, the ratio of axial deep N-well regions to gap area 730 can vary.

Additionally, the axial sub-surface mesh structure 700 enables the nFETS (n-type MOSFETS) 380 (FIGS. 3A and 3B) to be body-biased in any manner by preventing isolation of a P-type region or P-well region 385 (FIGS. 3A and 3B) on which the nFETS 380 are formed. The gap area 730 between axial deep N-well regions 710A-710E and 712A-712D prevent isolation of the P-well region 385 and enable a conductive path between the P-well region 385 and a sub-surface layer that is beneath the axial deep N-well regions 710A-710E and 712A-712D. In an embodiment, the area of the axial sub-surface mesh structure 700 is equally divided between axial deep N-well regions (e.g., 710A-710E and 712A-712D) and gap area 730.

As discussed above, a contact for the body-bias voltage Vnw can be formed wherever there is free space, such as above the N-well regions or above the axial deep N-well regions 710A-710E and 712A-712D. Moreover, the location and size of the axial sub-surface mesh structure 700 is based on the distribution of the N-wells and the P-type regions or P-wells, wherein the goal is to provide low resistance conductive paths for the body-bias voltage Vnw.

As described above, the size of the axial sub-surface mesh structure 700 should avoid isolating the P-type regions or P-wells 385 (FIGS. 3A and 3B) from sub-surface layers that are formed beneath the axial deep N-well regions 710A-710E and 712A-712D. Moreover, the gap area 730 is sized so that to provide a low-resistance conductive path between the P-type regions or P-wells 385 and a sub-surface layer that is formed beneath the axial deep N-well regions, wherein the greater the gap area 730 the lower the resistance of this conductive path. Additionally, lateral diffusion and lateral depletion can further reduce the gap area 730, potentially pinching-off this conductive path between the P-type regions or P-wells 385 and a sub-surface layer that is formed beneath the axial deep N-well regions. As a solution to this situation, the gaps 740A and 740B between adjacent axial deep N-well regions are made sufficiently wide to avoid pinching-off this conductive path between the P-type regions or P-wells 385 and a sub-surface layer that is formed beneath the axial deep N-well regions. Yet, as the number and size of the axial deep N-well regions are increased, the resistance of the conductive path for routing the body-bias voltage Vnw is decreased because there are larger and more sub-surface conductive boundaries between the N-well regions and the axial deep N-well regions. Hence, there is a trade-off between the gap area 730 and the axial deep N-well regions in each design situation.

Figure 8A:
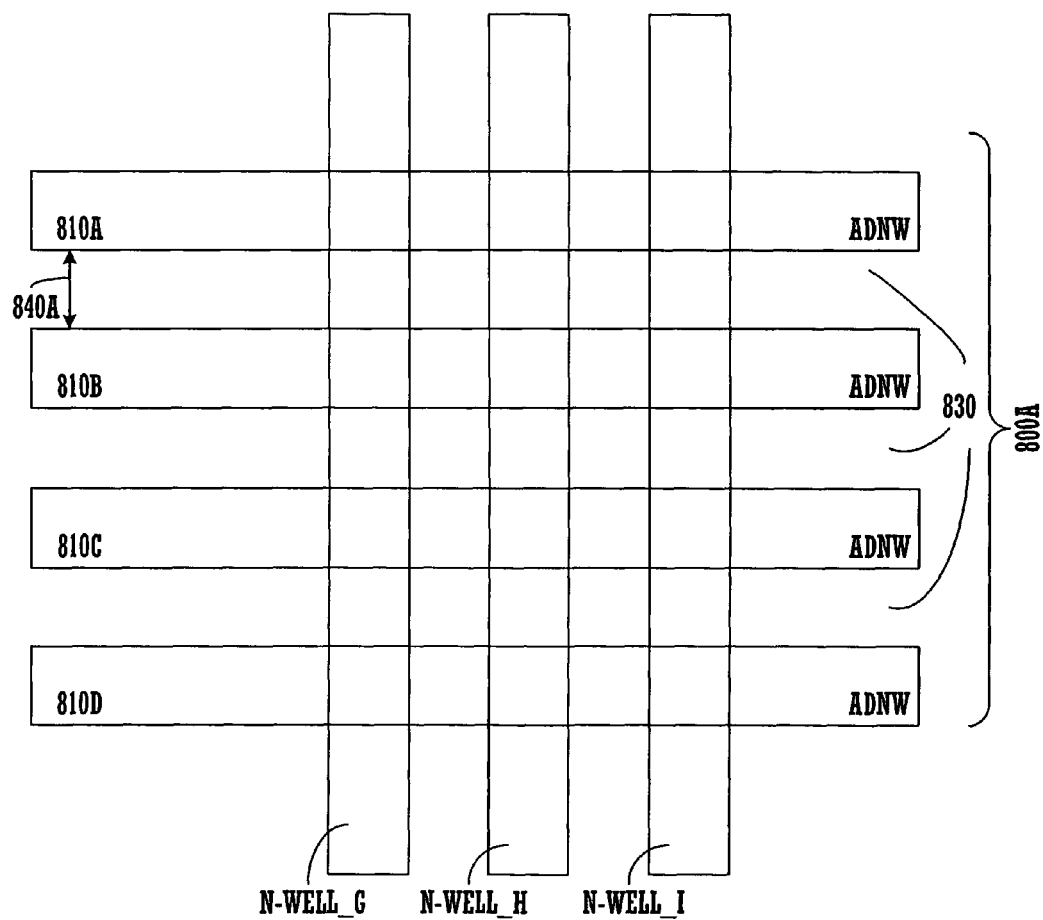
FIG. 8A illustrates a top view of multiple axial deep N-well (ADNW) regions forming a first axial sub-surface strip structure in accordance with an embodiment of the present invention.

FIG. 8A illustrates a top view of multiple axial deep N-well (ADNW) regions forming a first axial sub-surface strip structure 800A in accordance with an embodiment of the present invention. In this layout pattern, each axial deep N-well region 810A-810D has a strip shape, is formed beneath the surface N-well layer of a semiconductor device, and is doped with an N-type material. The axial deep N-well regions 810A-810D are formed in a first parallel orientation. The first parallel orientation is parallel to the surface N-well regions (e.g., N-well_G, N-well_H, and N-well_I). In this case, the combination of the surface N-well regions (e.g., N-well_G, N-well_H, and N-well_I) and the first axial sub-surface strip structure 800A forms a mesh-type arrangement for routing the body-bias voltage to the surface N-well regions so that the pFETs can be body-biased.

As described above with respect to FIGS. 2A and 2B, the layer corresponding to the deep N-well region is below the layer corresponding to the surface N-well regions. Hence, sub-surface conductive boundaries can be formed between the N-well regions and the first axial sub-surface strip structure 800A to provide a plurality of sub-surface conductive paths between N-well regions without isolating the P-well region located between the N-wells. That is, the first axial sub-surface strip structure 800A contacts the N-wells along the sub-surface conductive boundaries (e.g., sub-surface conductive boundary 25 (FIG. 2A) and sub-surface conductive boundaries 396 and 397 (FIG. 2B)).

As described above, the combination of the surface N-well regions (e.g., N-well_G, N-well_H, and N-well_I), and the axial deep N-well regions 810A-810D, which form the first axial sub-surface strip structure 800A, facilitate routing of the body-bias voltage Vnw to the N-well regions so that the pFETs can be body-biased. The first axial sub-surface strip structure 800A can be utilized in areas of the semiconductor device that have a dense layout and are oriented according to the N-well regions of FIG. 3B. It should be understood that the first axial sub-surface strip structure 800A can have other configurations. The gap 840A between adjacent axial deep N-well regions can vary in size. Moreover, the ratio of axial deep N-well regions to gap area 830 can vary.

Figure 8B:
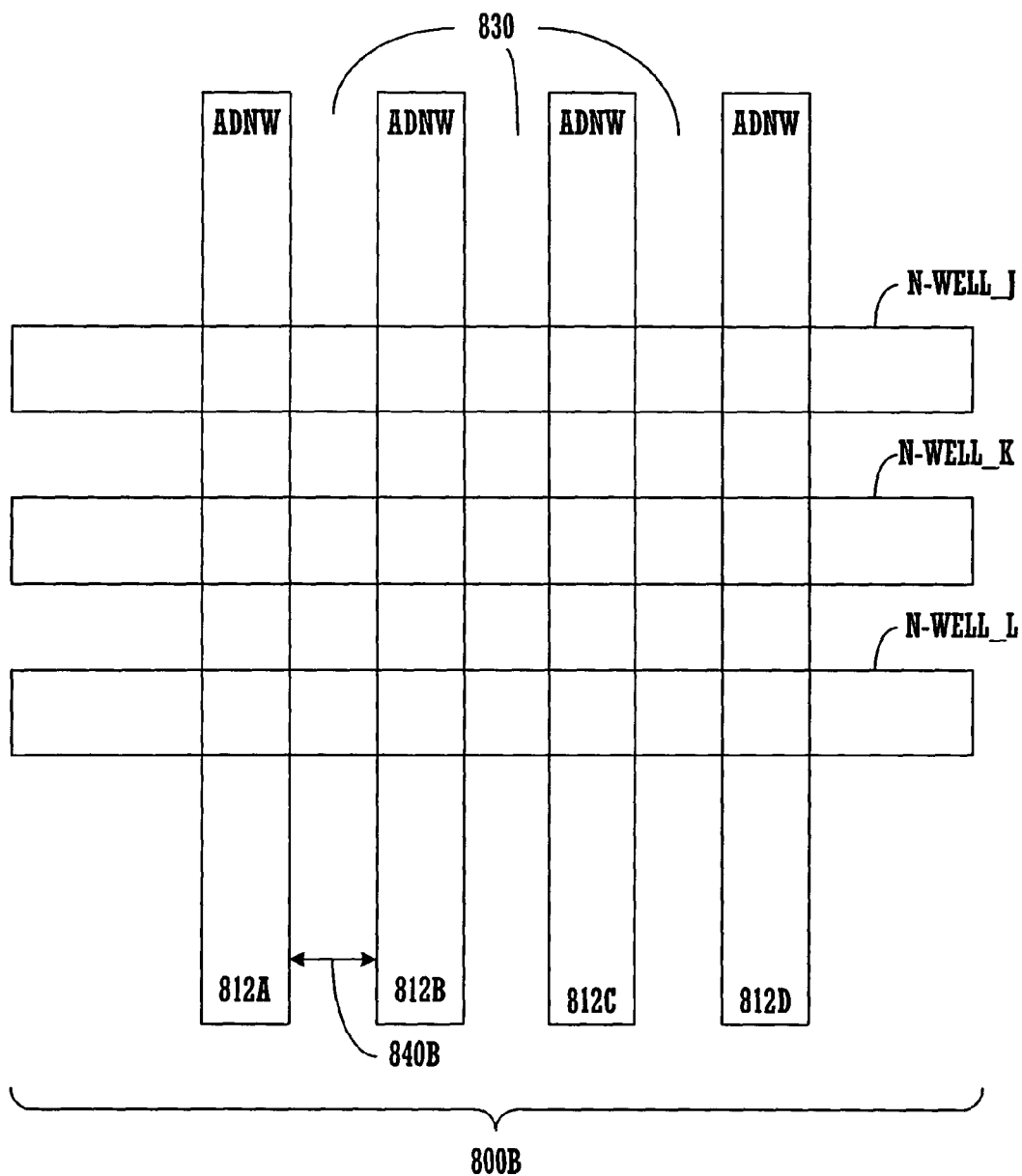
FIG. 8B illustrates a top view of multiple axial deep N-well (ADNW) regions forming a second axial sub-surface strip structure in accordance with an embodiment of the present invention.

FIG. 8B illustrates a top view of multiple axial deep N-well (ADNW) regions forming a second axial sub-surface strip structure 800B in accordance with an embodiment of the present invention. In this layout pattern, each axial deep N-well region 812A-812D has a strip shape, is formed beneath the surface N-well layer of a semiconductor device, and is doped with an N-type material. The axial deep N-well regions 812A-812D are formed in a second parallel orientation. The second parallel orientation is parallel to the surface N-well regions (e.g., N-well_J, N-well_K, and N-well_L). In this case, the combination of the surface N-well regions (e.g., N-well_J, N-well_K, and N-well_L) and the second axial sub-surface strip structure 800B forms a mesh-type arrangement for routing the body-bias voltage to the surface N-well regions so that the pFETs can be body-biased.

As described above with respect to FIGS. 2A and 2B, the layer corresponding to the deep N-well region is below the layer corresponding to the surface N-well regions. Hence, sub-surface conductive boundaries can be formed between the N-well regions and the second axial sub-surface strip structure 800B to provide a plurality of sub-surface conductive paths between N-well regions without isolating the P-well region located between the N-wells. That is, the second axial sub-surface strip structure 800B contacts the N-wells along the sub-surface conductive boundaries (e.g., sub-surface conductive boundary 25 (FIG. 2A) and sub-surface conductive boundaries 396 and 397 (FIG. 2B)).

As described above, the combination of the surface N-well regions (e.g., N-well_J, N-well_K, and N-well_L), and the axial deep N-well regions 812A-812D, which form the second axial sub-surface strip structure 800A, facilitate routing of the body-bias voltage Vnw to the N-well regions so that the pFETs can be body-biased. The second axial sub-surface strip structure 800B can be utilized in areas of the semiconductor device that have a dense layout and are oriented according to the N-well regions of FIG. 3A. It should be understood that the second axial sub-surface strip structure 800B can have other configurations. The gap 840B between adjacent axial deep N-well regions can vary in size. Moreover, the ratio of axial deep N-well regions to gap area 830 can vary.

Generating a Semiconductor Design Layout Having a Deep Well Structure for Routing Body-Bias Voltage Typically, a semiconductor device is fabricated using a semiconductor design layout and one of several fabrication processes. The semiconductor design layout represents the composition and layout of each component and layer of the semiconductor device. Advances in semiconductor technology have enabled the fabrication of semiconductor devices with a greater number of components. The semiconductor design layouts of these semiconductor devices are complex and time-consuming to create. As a result, a hierarchical design technique has been applied to the semiconductor design layout. This allows various portions of the semiconductor design layout to be generated, verified and tested in parallel, reducing costs and time allocated to the semiconductor design layout.

The layout of the deep well structure (see FIGS. 2A to 8B) for a semiconductor design layout provides an opportunity to use a tiling technique to generate the layout of the deep well structure. In general, the tiling technique involves creating a tile having a pattern, performing a placement operation to place an array of the tiles on the semiconductor design layout, flattening the hierarchical arrangement of the semiconductor design layout in areas where there is a design error, customizing these areas to eliminate the design error in an ad hoc manner, and verifying the flattened semiconductor design layout after the customization. This tiling technique is time-consuming and inefficient since verification of the flattened semiconductor design layout after the customization is slow and complex.

In accordance with the present invention, a semiconductor design layout is generated that has a deep well structure for routing body-bias voltage, wherein the deep well structure is a conductive sub-surface structure. Both standard pattern tiles and custom pattern tiles are used to generate the semiconductor design layout. Moreover, a grid is used that promotes automation and efficiency. Thus, the layout of the deep well structure of the semiconductor design layout may be generated and verified in days instead of weeks.

Figure 9A:
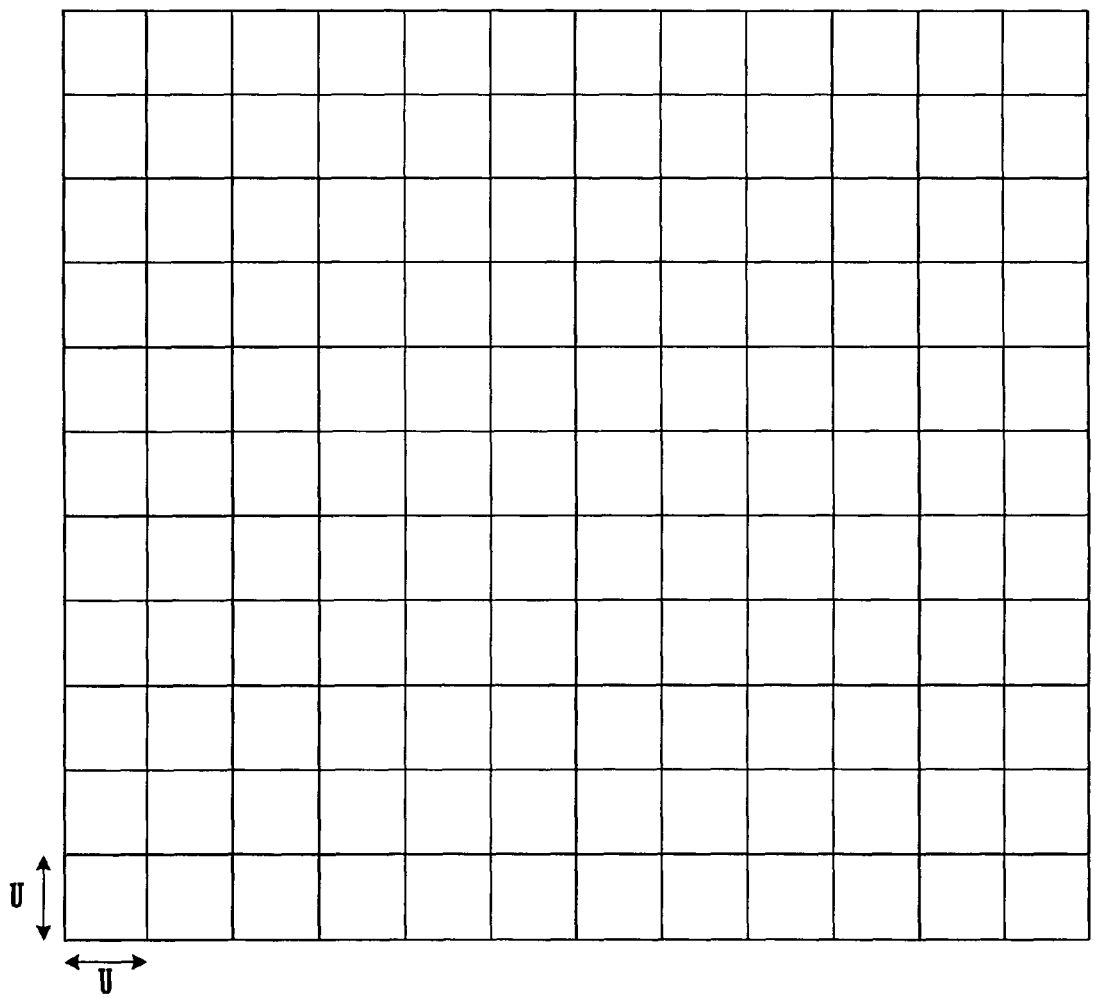
FIG. 9A illustrates a grid for a semiconductor design layout in accordance with an embodiment of the present invention.

FIG. 9A illustrates a grid 900A for a semiconductor design layout in accordance with an embodiment of the present invention. The grid 900A is a course grid instead of a fine grid. That is, the grid unit U is larger than the grid unit of a typical grid utilized for design layout applications. Further, the grid unit U is larger than a minimum dimension available for the components of the semiconductor design layout. In an embodiment, the grid unit U is 96 micrometers. In the hierarchical design technique, the semiconductor design layout is partitioned into a plurality of blocks. Components (e.g., cells, metal wire, etc.) may be placed, routed, and verified in these blocks in parallel. As will be described below, the blocks of the semiconductor design layout are placed on the grid 900A.

Figure 9B:
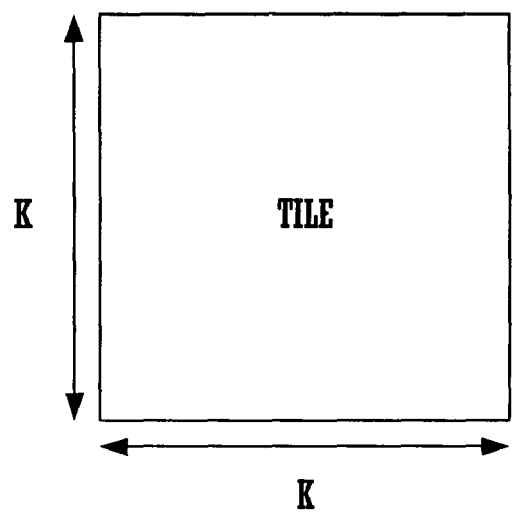
FIG. 9B illustrates a tile having a tile shape and a tile size in accordance with an embodiment of the present invention.

The grid unit U of the grid 900A influences a tile shape and a tile size of the tile utilized to generate the semiconductor design layout having the deep well structure. FIG. 9B illustrates a tile 900B having a tile shape and a tile size in accordance with an embodiment of the present invention. The tile shape and the tile size of the tile 900B fit an integer number of times into the grid unit U. If K is the length and width of tile 900B, then K and the grid unit U are related as follows:

$$U=N*K,\qquad \text{Eq. (1)}$$

wherein N is an integer number. In an embodiment, K is 48 micrometers and N is 2.

Figure 10A:
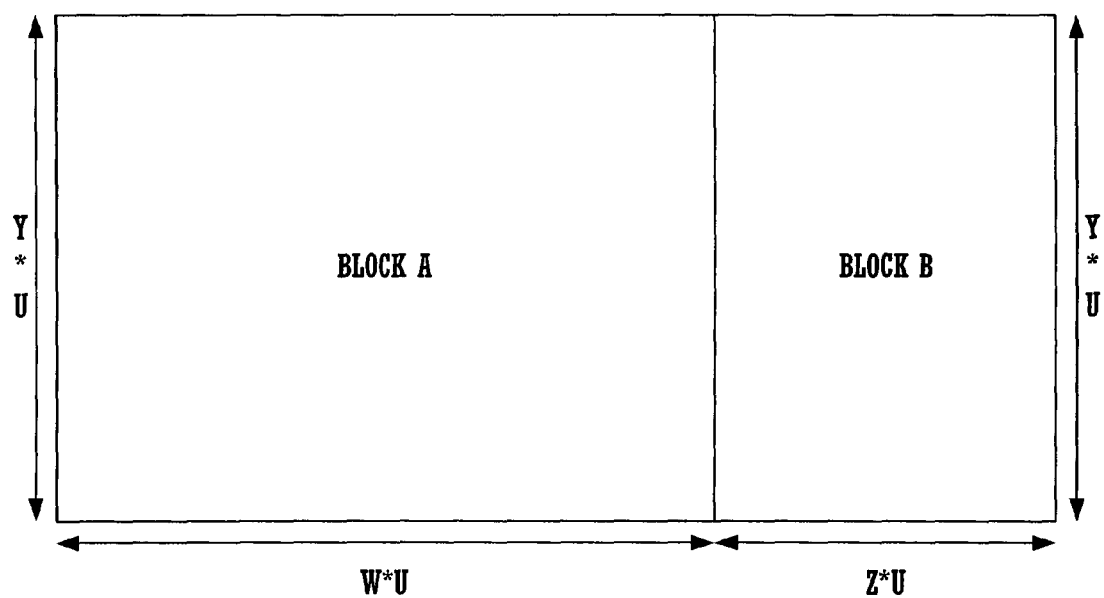
FIG. 10A illustrates a first placement of a plurality of blocks of a semiconductor design layout on the grid of FIG. 9A in accordance with an embodiment of the present invention.

FIG. 10A illustrates a first placement of a plurality of blocks (e.g., Block A and Block B) of a semiconductor design layout on the grid 900A of FIG. 9A in accordance with an embodiment of the present invention. The size and shape of the blocks (e.g., Block A and Block B) of the semiconductor design layout are dependent on the grid unit U of the grid 900A. That is, the width and length of each block is a multiple of the grid unit U. Block A has a width that is the product of W*U, wherein W is an integer number. Block A has a length that is the product of Y*U, wherein Y is an integer number. Continuing, Block B has a width that is the product of Z*U, wherein Z is an integer number. Block B has a length that is the product of Y*U, wherein Y is an integer number.

Figure 10B:
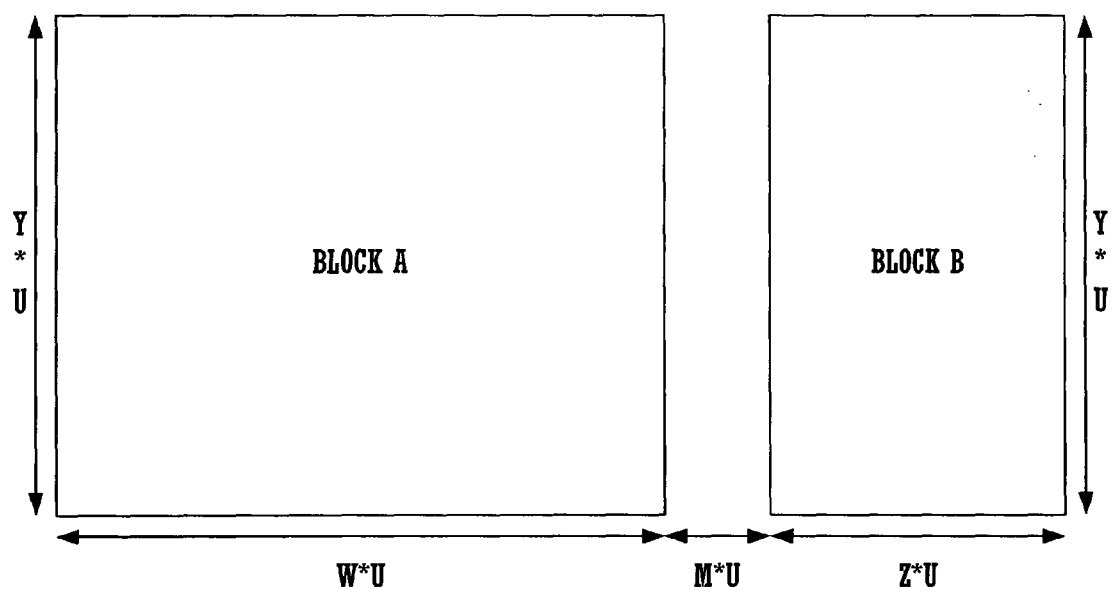
FIG. 10B illustrates a second placement of a plurality of blocks of a semiconductor design layout on the grid of FIG. 9A in accordance with an embodiment of the present invention.

As depicted in FIG. 10A, Block A abuts Block B. However, FIG. 10B illustrates a second placement of a plurality of blocks (e.g., Block A and Block B) of a semiconductor design layout on the grid 900A of FIG. 9A in accordance with an embodiment of the present invention. Here, the space (M*U) separates Block A from Block B, wherein M is an integer number. That is, the space that separates each block from each other is a multiple of the grid unit U. Alternatively, the space that separates Block A from Block B does not have to be constraint to a multiple of the grid unit U. This is possible because the space generally has routing wire and no (or few) active devices so that potentially any tile size and tile pattern for the deep well structure may be used in the space that separates the blocks without causing problems to the semiconductor design layout.

The grid-based constraint on the tile 900B and on the blocks (e.g., Block A and Block B) of the semiconductor design layout prevents the tile 900B from being placed partially in a first block and partially in a second block, which would require the first and second blocks to be flattened and would lead to slow and complex verification. Further, this grid-based constraint prevents the tile 900B from being placed partially in a block and partially in the space separating the blocks, which would require the block and the space separating the blocks to be flattened and would also lead to slow and complex verification. That is, the grid-based constraint helps to keep the hierarchical design of the semiconductor design layout having the deep well structure while the semiconductor design layout is being generated and verified.

Figure 11A:
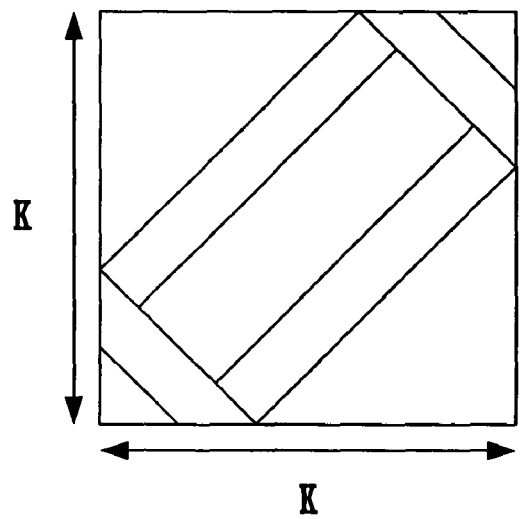
FIG. 11A illustrates a standard pattern tile in accordance with an embodiment of the present invention.

FIG. 11A illustrates a standard pattern tile 1100A in accordance with an embodiment of the present invention. The pattern of the standard pattern tile 1100A is dependent on the arrangement of the deep well structure. As described above, the deep well structure may be arranged as a diagonal sub-surface mesh structure (FIGS. 5A and 5B), a diagonal sub-surface strip structure (FIGS. 6A and 6B), an axial sub-surface mesh structure (FIG. 7), an axial sub-surface strip structure (FIGS. 8A and 8B), or any other arrangement. In an embodiment, the deep well structure is a deep N-well structure having an N-type doping. In another embodiment, the deep well structure is a deep P-well structure having a P-type doping. Here, the pattern of the standard pattern tile 1100A corresponds to the deep well structure being arranged as a diagonal sub-surface mesh structure (FIGS. 5A and 5B).

Further, the standard pattern tile 1100A has the tile shape and the tile size of the tile 900B of FIG. 9B. That is, the tile shape and the tile size of the standard pattern tile 1100A fit an integer number of times into the grid unit U. If K is the length and width of the standard pattern tile 1100A, then K and the grid unit U are related as depicted in Eq. (1) above.

Figure 11B:
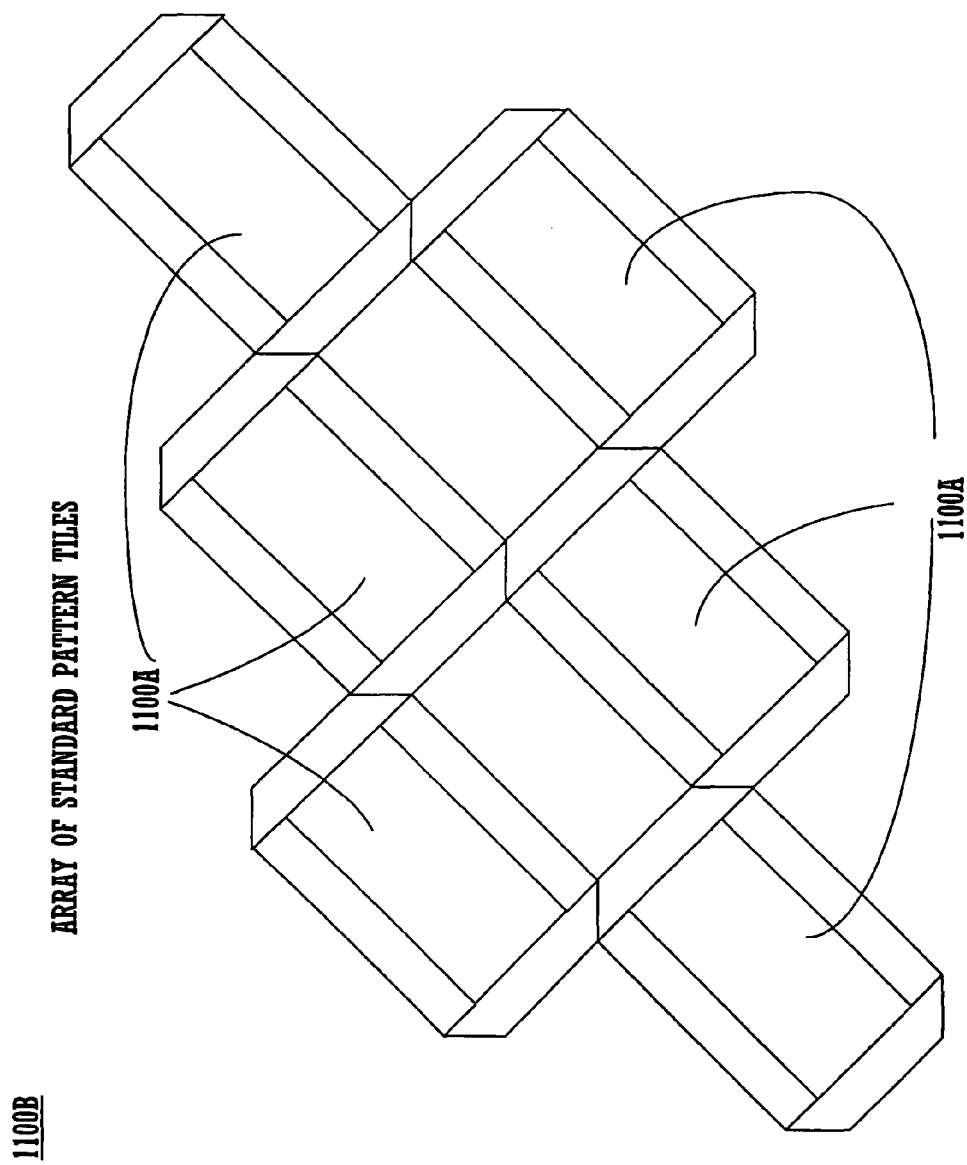
FIG. 11B illustrates an array of standard pattern tiles in accordance with an embodiment of the present invention.
Figure 12B:
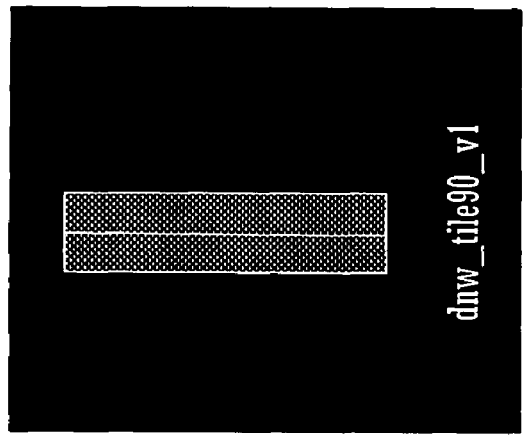
FIGS. 12A-12H illustrate a plurality of custom pattern tiles in accordance with an embodiment of the present invention.
Figure 12A:
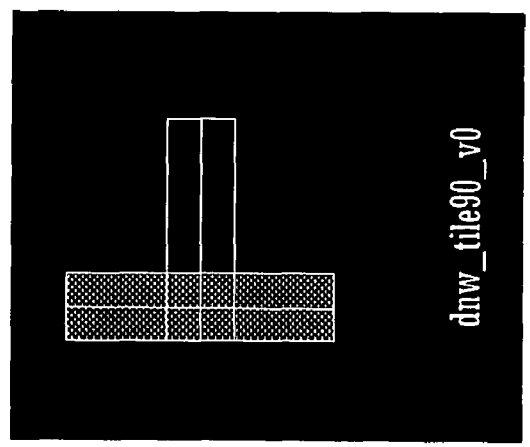
Figure 12D:
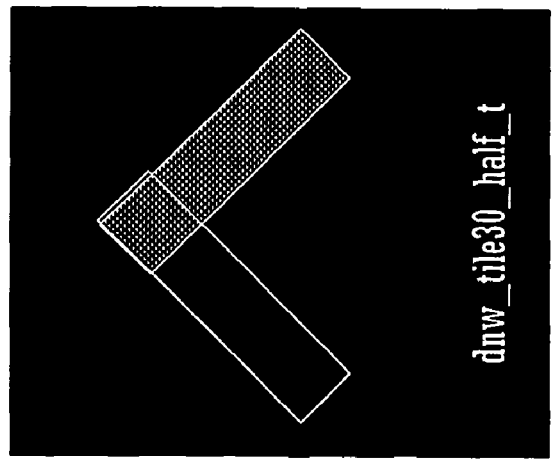
Figure 12C:
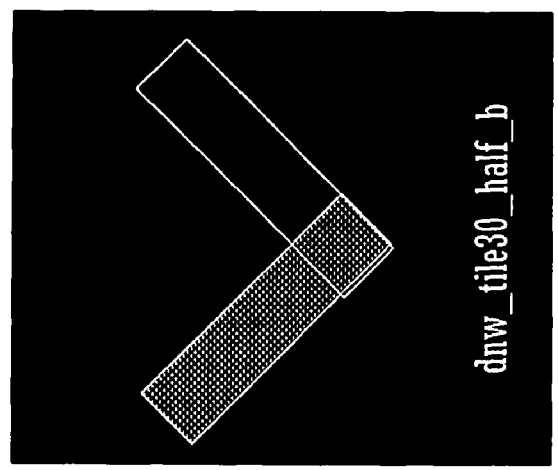
Figure 12F:
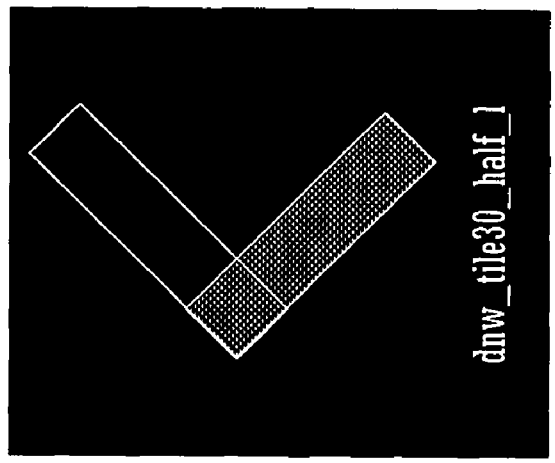
Figure 12E:
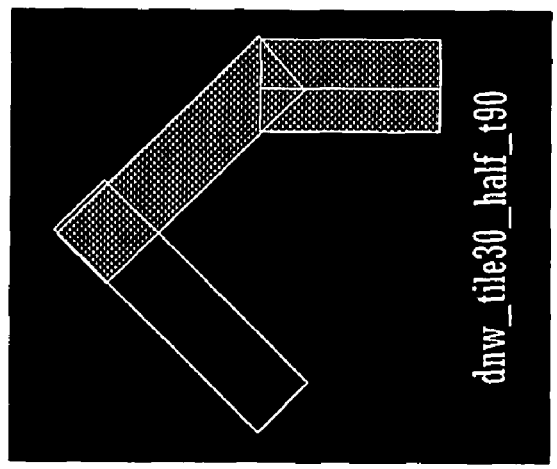
Figure 12H:
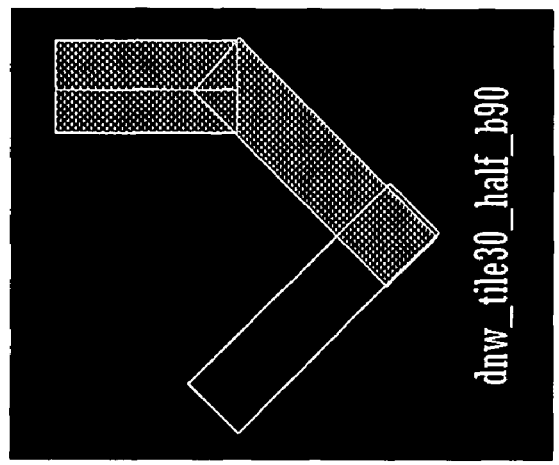
Figure 12G:
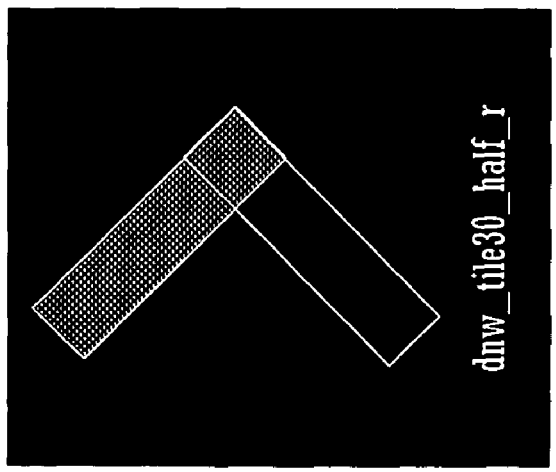

An array 1100B of standard pattern tiles 1100A in accordance with an embodiment of the present invention is illustrated in FIG. 11B. A placement operation may be performed to place the array 1100B in the blocks of the semiconductor design layout. The array 1100B may also be placed in the space separating the blocks.

FIGS. 12A-12H illustrate a plurality of custom pattern tiles in accordance with an embodiment of the present invention. Each custom pattern tile has the tile shape and the tile size of the tile 900B of FIG. 9B. That is, the tile shape and the tile size of each custom pattern tile fit an integer number of times into the grid unit U. If K is the length and width of each custom pattern tile, then K and the grid unit U are related as depicted in Eq. (1) above. The custom pattern tiles (FIGS. 12A-12H) provide a range of patterns to correct a design error in areas of the semiconductor design layout caused by standard pattern tiles 1100A. Instead of customizing these areas in an ad hoc manner, standard pattern tiles 1100A may be individually selected and replaced with a custom pattern tile (FIGS. 12A-12H). This is simpler and more efficient. Additional custom pattern tiles may be created. Experience with other semiconductor design layouts may inspire creation of other custom pattern tiles.

Figure 13:
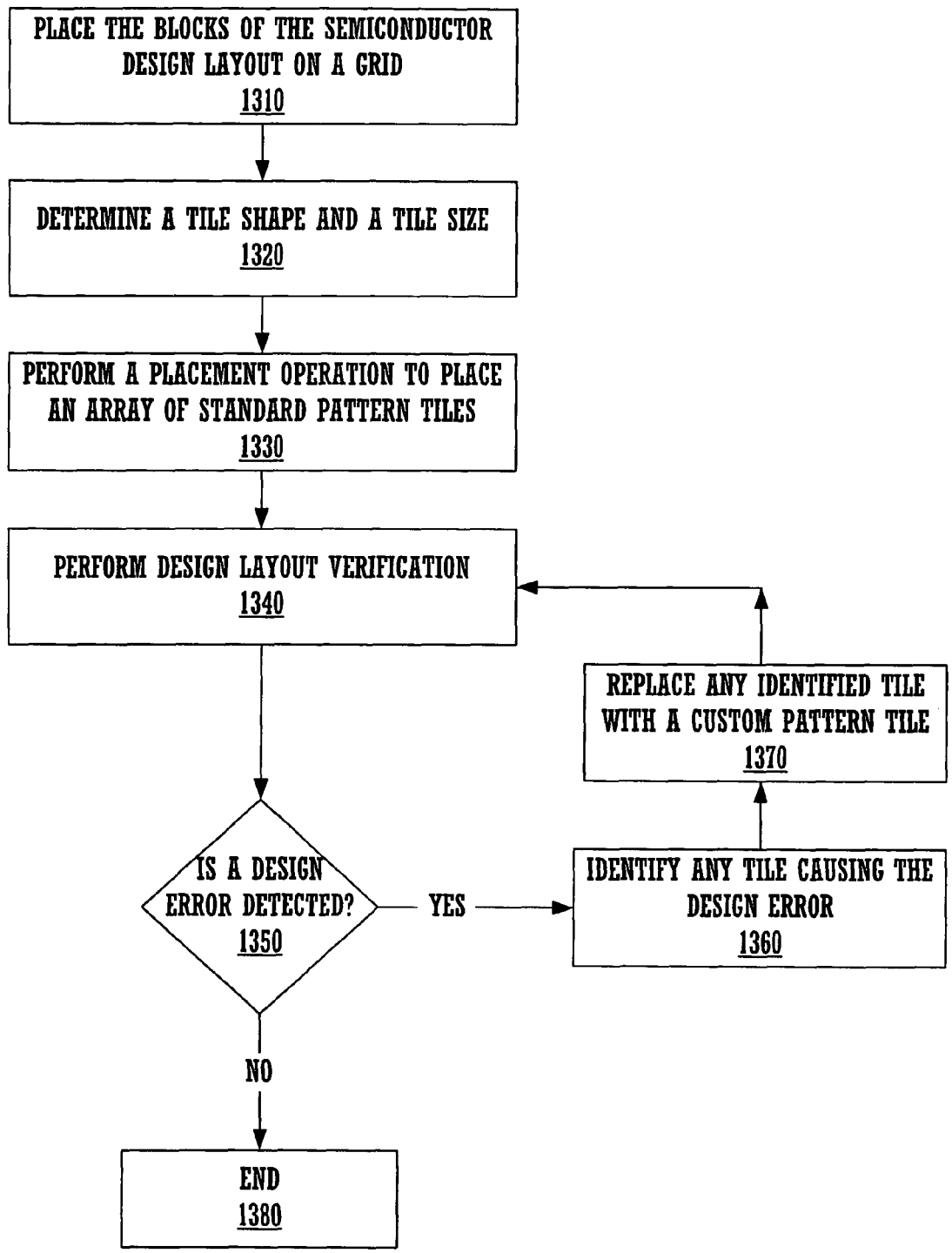
FIG. 13 illustrates a flow chart showing a method of generating a semiconductor design layout having a deep well structure for routing voltage in accordance with an embodiment of the present invention.

FIG. 13 illustrates a flow chart showing a method 1300 of generating a semiconductor design layout having a deep well structure for routing voltage in accordance with an embodiment of the present invention. A semiconductor device may be formed from this semiconductor design layout having a deep well structure for routing voltage, wherein the fabricated semiconductor device includes the deep well structure. In an embodiment, the present invention is implemented as computer-executable instructions for performing aspects of the present invention illustrated with the method 1300. The computer-executable instructions may be stored in any type of computer-readable medium, such as a magnetic disk, CD-ROM, an optical medium, a floppy disk, a flexible disk, a hard disk, a magnetic tape, a RAM, a ROM, a PROM, an EPROM, a flash memory, or any other medium from which a computer can read.

At Block 1310, the blocks (e.g., Block A and Block B of FIGS. 10A-10B) of the semiconductor design layout are placed on a grid 900A (FIG. 9A). The grid 900A has a grid unit U that is larger than a minimum dimension available for the semiconductor design layout.

Continuing, at Block 1320, a tile shape and a tile size of a tile 900B (FIG. 9B) is determined, wherein the tile 900B facilitates generating the semiconductor design layout having the deep well structure. In an embodiment, the tile shape and the tile size of the tile 900B fit an integer number of times into the grid unit U.

Moreover, at Block 1330, a placement operation is performed to place an array of standard pattern tiles 1100A (FIG. 11A) into the blocks (e.g., Block A and Block B of FIGS. 10A-10B) of the semiconductor design layout. The standard pattern tiles 1100A may also be placed in the space separating the blocks (see FIG. 10B). Each standard pattern tile 1100A has the tile shape and the tile size of the tile 900B. The pattern of the standard pattern tile 1100A is dependent on the arrangement of the deep well structure. In particular, the pattern of the standard pattern tile 1100A corresponds to the deep well structure being arranged as a diagonal sub-surface mesh structure (FIGS. 5A and 5B). At Block 1340, design layout verification is performed. For example, LVS (layout versus schematic) and DRC (design rule check) may be performed.

Figure 14:
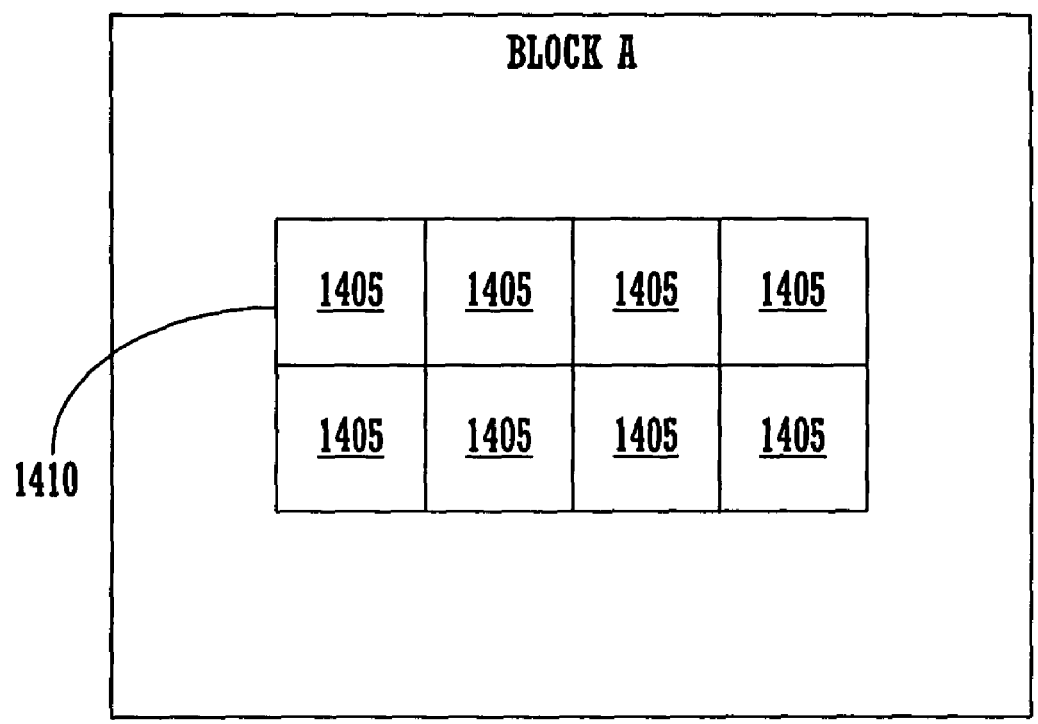
FIG. 14 illustrates an area having a plurality of standard pattern tiles causing a design error in accordance with an embodiment of the present invention.

At Block 1350, it is determined whether a design error is detected. As discussed above, a constraint on the arrangement of the deep well structure is to avoid isolating P-type regions or P-well regions on which nFETS (or n-type MOSFETS) are formed, allowing the formation of conductive paths between the P-type regions or P-well regions and a sub-surface layer (e.g., doped with P-type material) that is formed beneath the deep N-well structure. This constraint may cause design errors if it is not met. If a design error is not detected, the method 1300 ends at Block 1380. If a design error is detected, any standard pattern tile causing the design error is identified, at Block 1360. FIG. 14 illustrates an area 1410 having a plurality of standard pattern tiles 1405 causing a design error in accordance with an embodiment of the present invention. The area 1410 is in Block A of the semiconductor design layout.

Figure 15:
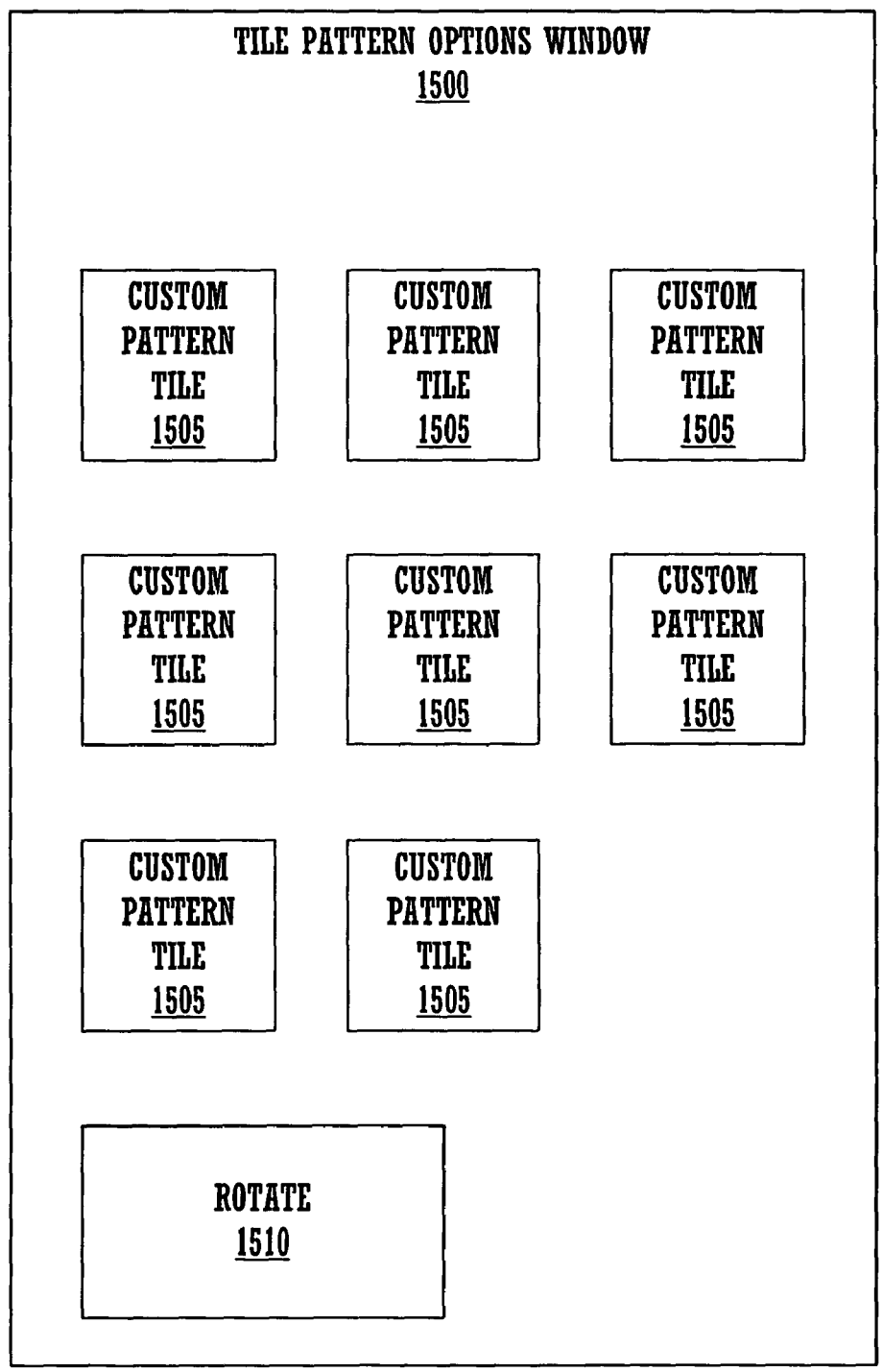
FIG. 15 illustrates a tile pattern options window in accordance with an embodiment of the present invention.

Referring again to FIG. 13, at Block 1370, any identified standard pattern tile 1405 is replaced with a custom pattern tile (FIGS. 12A-12H) selected from a plurality of available custom pattern tiles (FIGS. 12A-12H). Each custom pattern tile (FIGS. 12A-12H) has the tile shape and the tile size of the tile 900B. In an embodiment, a tile pattern options window is provided in order to perform the customization of the semiconductor design layout. FIG. 15 illustrates a tile pattern options window 1500 in accordance with an embodiment of the present invention. The tile pattern options window 1500 has the plurality of available custom pattern tiles 1505. Additionally, the tile pattern options window 1500 has a button 1510 that enables the rotation of the available custom pattern tiles 1505 to different orientations. These custom pattern tiles 1505 are intended to help the arrangement of the deep well structure to meet the constraint discussed above. In practice, an identified standard pattern tile 1405 is individually selected. A custom pattern tile is selected from the available custom pattern tiles 1505. The identified standard pattern tile 1405 is replaced with the selected custom pattern tile 1505. As described above, the standard pattern tile and each custom pattern tile have the same tile shape and the same tile size.

After Block 1370, the design layout verification is repeated at Block 1340. At Block 1350, if it determined that the design error continues to exist, Blocks 1360,1370 and 1340 are repeated. Besides replacing an identified standard pattern tile 1405 with a custom pattern tile, a previously selected custom pattern tile may also be replaced with another custom pattern tile.

In an embodiment, Blocks 1330, 1340, 1350, 1360, and 1370 of the method 1300 are performed separately for each of the blocks (e.g., Block A and Block B of FIGS. 10A-10B) of the semiconductor design layout. This enables generation of the semiconductor design layout in a parallel manner at the block level, reducing the complexity and the time to complete the semiconductor design layout.

Figure 16:
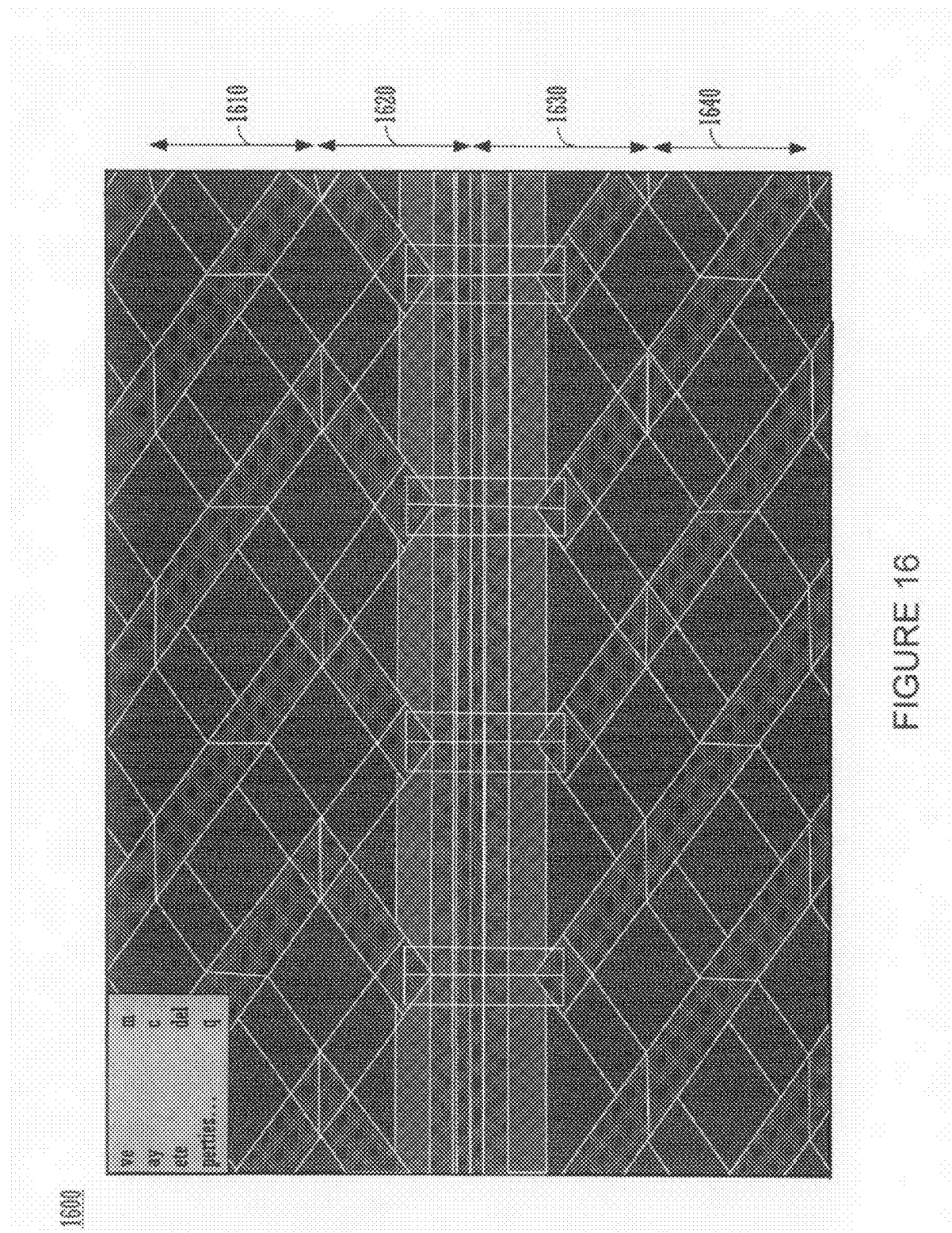
FIG. 16 illustrates a semiconductor design layout in accordance with an embodiment of the present invention.

FIG. 16 illustrates a semiconductor design layout 1600 in accordance with an embodiment of the present invention. The semiconductor design layout 1600 is generated using the method 1300 (FIG. 13). As depicted in FIG. 16, the semiconductor design layout 1600 includes rows 1610 and 1640, which have standard pattern tiles. Further, the semiconductor design layout 1600 includes rows 1620 and 1630, which have custom pattern tiles selected from the tile pattern options window 1500 (FIG. 15) having the plurality of available custom pattern tiles 1505 (FIG. 15).

FIG. 17 illustrates an exemplary computer system 1700 on which embodiments of the present invention may be practiced. Aspects of the present invention can be implemented or executed on a computer system or any other computational system. Although a variety of different computer systems can be used with the present invention, an exemplary computer system 1700 is shown in FIG. 17.

With reference to FIG. 17, portions of the present invention are comprised of computer-readable and computer executable instructions which reside, for example, in computer-usable media of an electronic system such as the exemplary computer system 1700. FIG. 17 illustrates an exemplary computer system 1700 on which embodiments of the present invention may be practiced. It is appreciated that the computer system 1700 of FIG. 17 is exemplary only and that the present invention can operate within a number of different computer systems including general-purpose computer systems and embedded computer systems.

Computer system 1700 includes an address/data bus 110 for communicating information, a central processor 101 coupled with bus 110 for processing information and instructions, a volatile memory 102 (e.g., random access memory RAM) coupled with the bus 110 for storing information and instructions for the central processor 101 and a non-volatile memory 103 (e.g., read only memory ROM) coupled with the bus 110 for storing static information and instructions for the processor 101. Exemplary computer system 1700 also includes a data storage device 104 ("disk subsystem") such as a magnetic or optical disk and disk drive coupled with the bus 110 for storing information and instructions. Data storage device 104 can include one or more removable magnetic or optical storage media (e.g., diskettes, tapes), which are computer-readable memories. Memory units of computer system 1700 include volatile memory 102, non-volatile memory 103 and data storage device 104.

Exemplary computer system 1700 can further include a signal input/ouput communication device 108 (e.g., a network interface card "NIC") coupled to the bus 110 for interfacing with other computer systems. Also included in exemplary computer system 1700 of FIG. 17 is an alphanumeric input device 106 including alphanumeric and function keys coupled to the bus 110 for communicating information and command selections to the central processor 101. Exemplary computer system 1700 also includes a cursor control or directing device 107 coupled to the bus 110 for communicating user input information and command selections to the central processor 101. A display device 105 can also be coupled to the bus 110 for displaying information to the computer user. Display device 105 may be a liquid crystal device, other flat panel display, cathode ray tube, or other display device suitable for creating graphic images and alphanumeric characters recognizable to the user. Cursor control device 107 allows the user to dynamically signal the two-dimensional movement of a visible symbol (cursor) on a display screen of display device 105. Many implementations of cursor control device 107 are known in the art including a trackball, mouse, touch pad, joystick or special keys on alphanumeric input device 106 capable of signaling movement of a given direction or manner of displacement. Alternatively, it will be appreciated that a cursor can be directed and/or activated via input from alphanumeric input device 106 using special keys and key sequence commands.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of generating a semiconductor design layout, said method comprising:
    placing a plurality of blocks of said semiconductor design layout on a grid having a grid unit that is larger than a minimum dimension available for said semiconductor design layout;
    placing standard pattern tiles each standard pattern tile comprising a tile shape and a tile size such that said tile shape and said tile size fit an integer number of times into said grid unit; and
    replacing, by a computer, any error-causing standard pattern tile with a custom pattern tile.

2. The method of claim 1, wherein said replacing comprises:
    performing design layout verification; and
    if a design error is detected, identifying any standard pattern tile causing said design error.

3. The method of claim 2, wherein said replacing further comprises:
    selecting said custom pattern tile from a plurality of available custom pattern tiles; and
    repeating performance of said design layout verification.

4. The method of claim 3, wherein each available custom pattern tile comprises said tile shape and said tile size.

5. The method of claim 1, wherein each standard pattern tile comprises a pattern dependent on arrangement of a conductive sub-surface structure for routing voltage.

6. The method of claim 5, wherein said conductive sub-surface structure is arranged as at least one of a diagonal sub-surface mesh structure, a diagonal sub-surface strip structure, an axial sub-surface mesh structure, or an axial sub-surface strip structure.

7. The method of claim 5, wherein said conductive sub-surface structure comprises an N-type doping.

8. The method of claim 5, wherein said conductive sub-surface structure comprises a P-type doping.

9. A non-transitory computer-readable medium comprising computer-executable instructions stored therein, said computer-executable instructions comprising:
    instructions to place a plurality of blocks of a semiconductor design layout on a grid having a grid unit that is larger than a minimum dimension available for said semiconductor design layout;
    instructions to place standard pattern tiles, each standard pattern tile comprising a tile shape and a tile size such that said tile shape and said tile size fit an integer number of times into said grid unit; and
    instructions to replace any error-causing standard pattern tile with a custom pattern tile.

10. The computer-readable medium of claim 9, wherein said instructions to replace comprises:
    instructions to perform design layout verification; and
    instructions to identify any standard pattern tile causing a design error if said design error is detected.

11. The computer-readable medium of claim 10, wherein said instructions to replace further comprises:
    instructions to select said custom pattern tile from a plurality of available custom pattern tiles; and
    instructions to repeat performance of said design layout verification.

12. The computer-readable medium of claim 11, wherein each available custom pattern tile comprises said tile shape and said tile size.

13. The computer-readable medium of claim 9, wherein each standard pattern tile comprises a pattern dependent on arrangement of a conductive sub-surface structure for routing voltage.

14. The computer-readable medium of claim 13, wherein said conductive sub-surface structure is arranged as at least one of a diagonal sub-surface mesh structure, a diagonal sub-surface strip structure, an axial sub-surface mesh structure, or an axial sub-surface strip structure.

15. The computer-readable medium of claim 13, wherein said conductive sub-surface structure comprises an N-type doping.

16. The computer-readable medium of claim 13, wherein said conductive sub-surface structure comprises a P-type doping.

17. A method of generating a semiconductor design layout, said method comprising:
    using a grid comprising a grid unit that is larger than a minimum dimension available for said semiconductor design layout;
    placing standard pattern tiles each standard pattern tile comprising a tile shape and a tile size such that said tile shape and said tile size fit an integer number of times into said grid unit; and
    replacing, by a computer, any error-causing standard pattern tile with a custom pattern tile.

18. The method of claim 17, wherein said replacing comprises:
    performing design layout verification; and
    if a design error is detected, identifying any standard pattern tile causing said design error.

19. The method of claim 18, wherein said replacing further comprises:
    selecting said custom pattern tile from a plurality of available custom pattern tiles; and
    repeating performance of said design layout verification.

20. The method of claim 19, wherein each available custom pattern tile comprises said tile shape and said tile size.

* * * * *